(12) United States Patent
Huynh et al.

(10) Patent No.: US 9,553,506 B1
(45) Date of Patent: Jan. 24, 2017

(54) CHARGE PUMP STRENGTH CALIBRATION AND SCREENING IN CIRCUIT DESIGN

(71) Applicant: SanDisk Technologies Inc., Plano, TX (US)

(72) Inventors: Jonathan Huynh, San Jose, CA (US); Sung-En Wang, San Jose, CA (US); Jongmin Park, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/009,010

(22) Filed: Jan. 28, 2016

Related U.S. Application Data

(60) Provisional application No. 62/242,243, filed on Oct. 15, 2015.

(51) Int. Cl.
| | |
|---|---|
| G05F 1/10 | (2006.01) |
| G05F 3/02 | (2006.01) |
| H02M 3/07 | (2006.01) |
| H03L 7/089 | (2006.01) |

(52) U.S. Cl.
CPC ............. *H02M 3/07* (2013.01); *H03L 7/0891* (2013.01)

(58) Field of Classification Search
USPC ...................................... 327/536; 363/59, 60
See application file for complete search history.

(56) References Cited

U.S. PATENT DOCUMENTS

| | | | |
|---|---|---|---|
| 7,327,171 B2 | 2/2008 | Wich | |
| 7,683,700 B2 | 3/2010 | Huynh et al. | |
| 8,040,174 B2 | 10/2011 | Likhterov | |
| 8,294,509 B2 | 10/2012 | Pan et al. | |
| 8,699,247 B2 | 4/2014 | Nguyen et al. | |
| 9,208,895 B1 | 12/2015 | Huynh et al. | |
| 2009/0128212 A1 | 5/2009 | Liu et al. | |
| 2010/0085092 A1* | 4/2010 | Shin | H03L 7/087 327/157 |
| 2014/0085985 A1* | 3/2014 | Pan | G11C 5/145 365/185.18 |
| 2015/0002195 A1 | 1/2015 | Englekirk | |
| 2015/0054572 A1* | 2/2015 | Muench | G01R 19/0023 327/536 |
| 2015/0180333 A1* | 6/2015 | Jenkner | H02M 3/07 327/536 |
| 2016/0087525 A1* | 3/2016 | Zhu | H02M 3/07 327/157 |

(Continued)

*Primary Examiner* — Adam Houston
(74) *Attorney, Agent, or Firm* — Vierra Magen Marcus LLP

(57) ABSTRACT

Techniques and apparatuses for identifying weak charge pumps and for setting an optimal clock period for charge pumps to minimize variations in a current-voltage characteristic. A current sink which absorbs a specified current is connected to an output node of a charge pump. In one approach, a success or fail status is set for a charge pump by driving it with a specified clock period in a constantly pumping mode and determining if the output voltage reaches a specified output voltage. In another approach, a success or fail status is set for a charge pump by driving it with a specified clock period in a regulation mode and determining if the period in which the output voltage cycles is a specified multiple, e.g., 2×, of a period of the clock signal. In another approach, an optimal clock period is determined.

20 Claims, 19 Drawing Sheets

(56) References Cited

U.S. PATENT DOCUMENTS

2016/0181913 A1* 6/2016 Feng .................. H02M 3/07
327/536
2016/0204699 A1* 7/2016 Arakawa ............... H02M 3/156
327/536

* cited by examiner

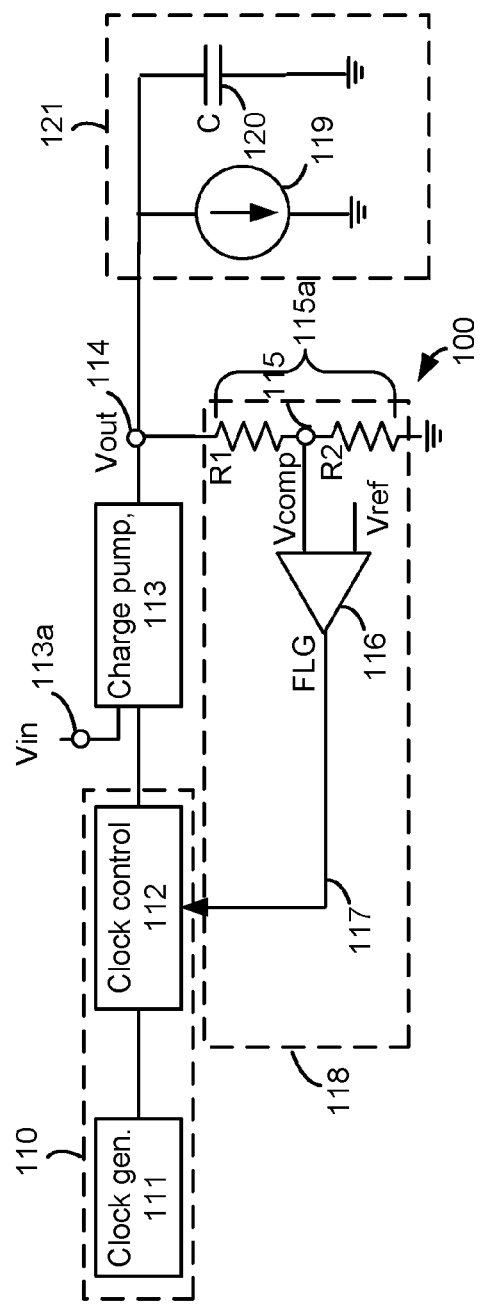
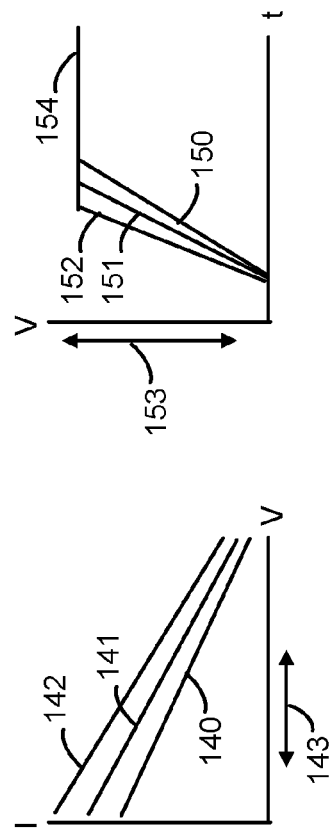
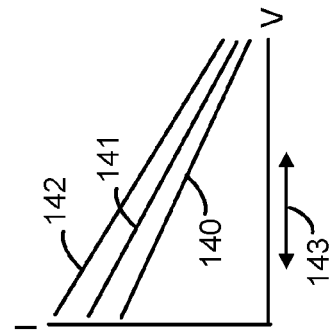
Fig. 1A
Fig. 1B
Fig. 1C

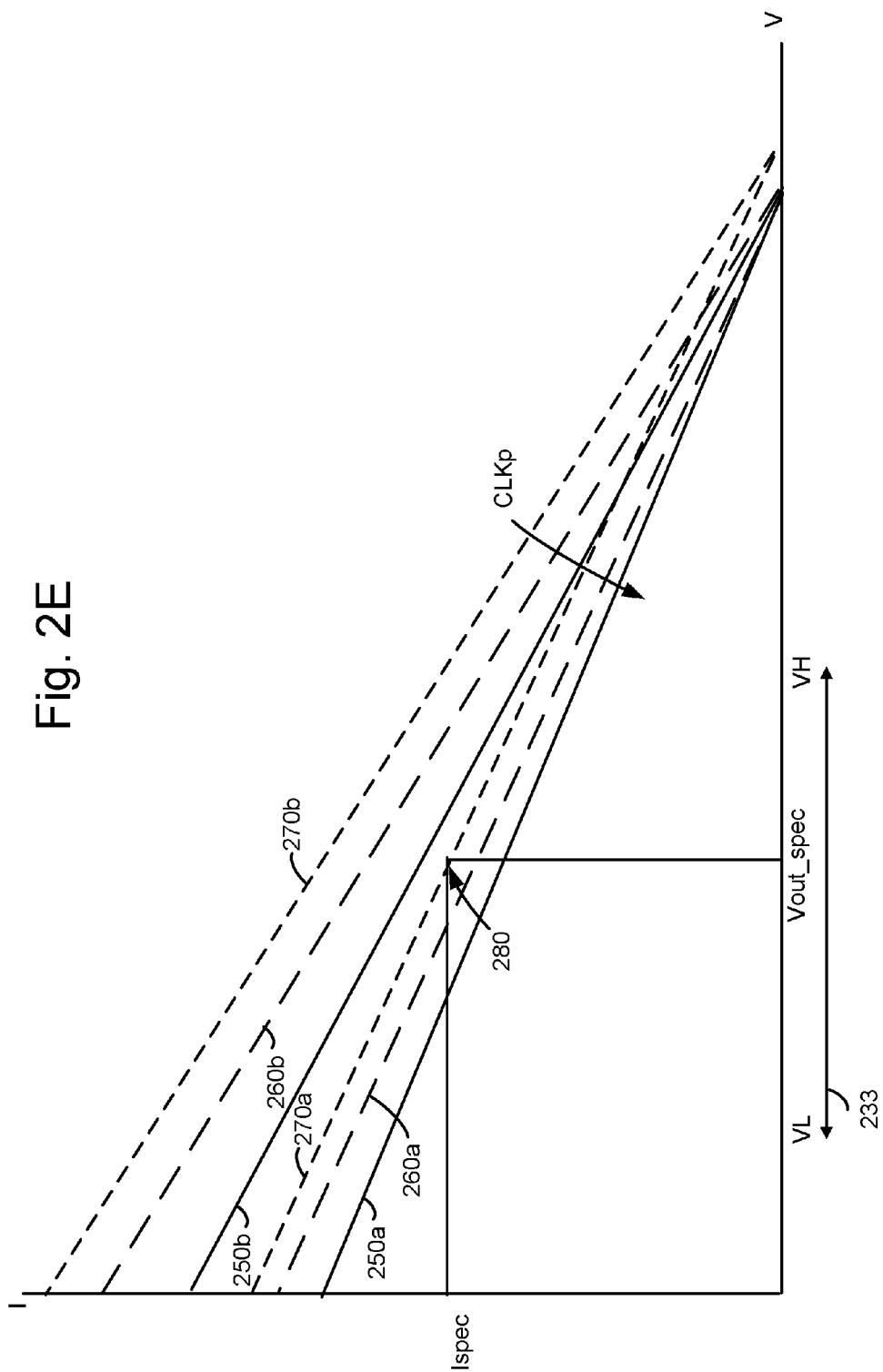

Fig. 6A

Determine a data point (Ispec, Vout_spec) in the ideal I-V plot for a charge pump, 600

↓

In a test mode, connect a current sink at Ispec to the output node of the charge pump, and apply a clock signal to the charge pump, 601

↓

Evaluate the output voltage of the charge pump, 602

Evaluate a cycling period of the flag relative to the period of the clock signal, 604

↓

Set success or fail status and/or optimal clock period, 603

Status=success ↓   Status=fail

In a regulation mode, disconnect the current sink from the output node and operate the charge pump at a range of voltages which includes Vout_spec, while a load connected to the output node, 605

Fig. 6B

Connect current sink at Ispec to output node of charge pump, 610

↓

Apply clock signal with specified period to charge pump, 611

↓

Set flag based on voltage of output node (Vout) relative to Vout_spec, 612

↓

Flag indicates Vout>Vout_spec?, 613 — no → Status=fail, 615

↓ yes

Status=success, 614

Fig. 6C

Connect current sink at Ispec to output node of charge pump, 620

↓

Apply clock signal with initial period to charge pump, 621

↓

Set flag based on voltage of output node (Vout) relative to Vout_spec, 622

↓

Cycling period of flag=2x period of clock signal?, 623 no → Change clock period, 625 → (loop back to 622)
  → Status=fail, 626 yes ↓

Status=success, 624

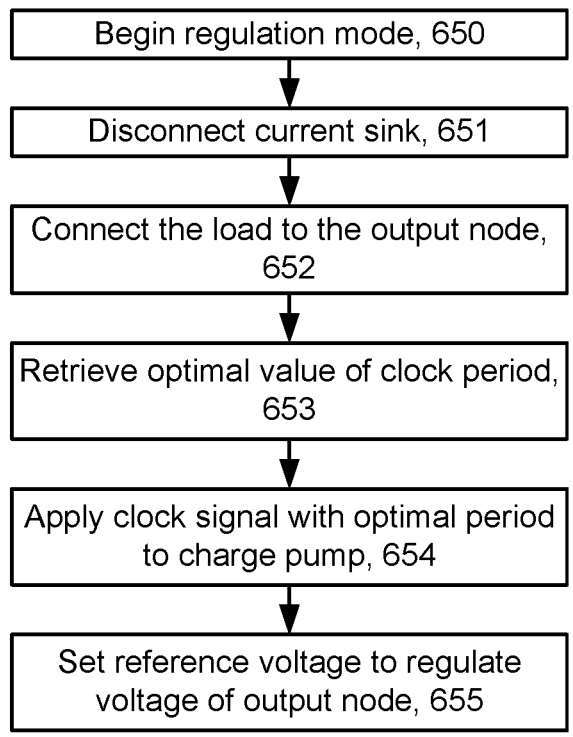

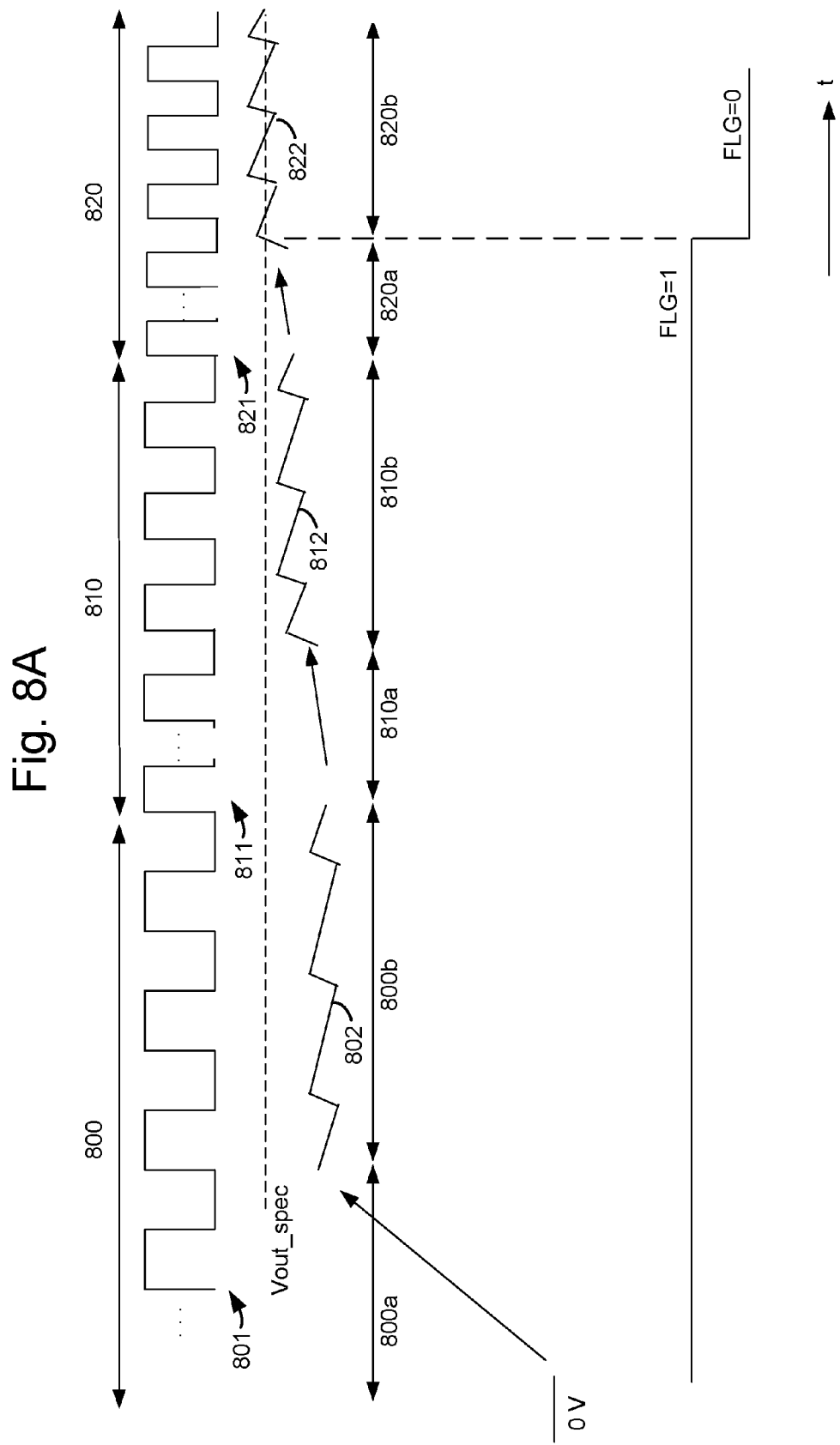

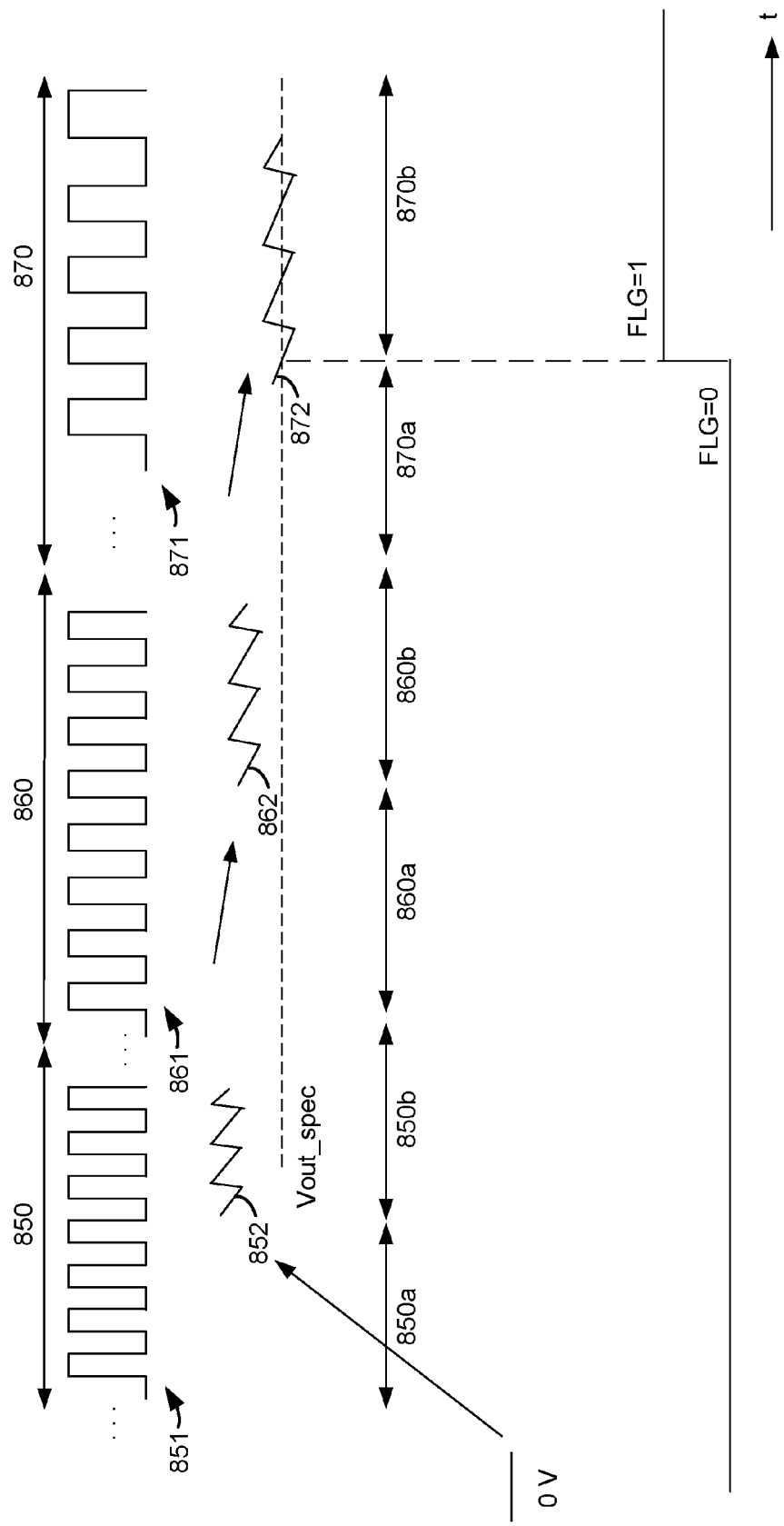

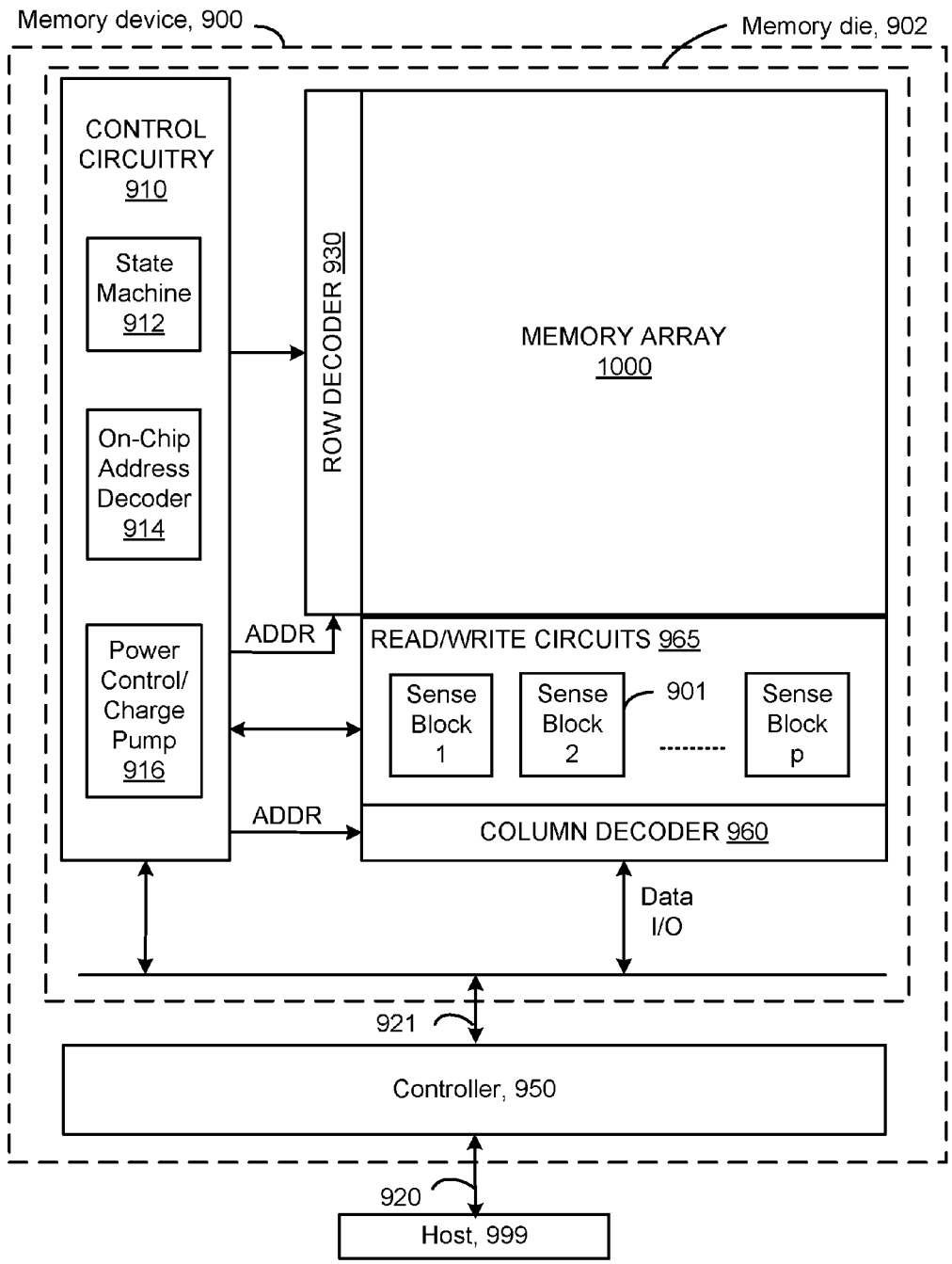

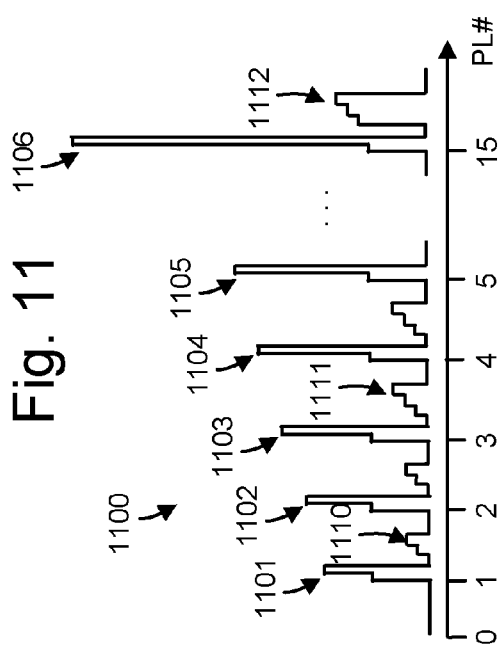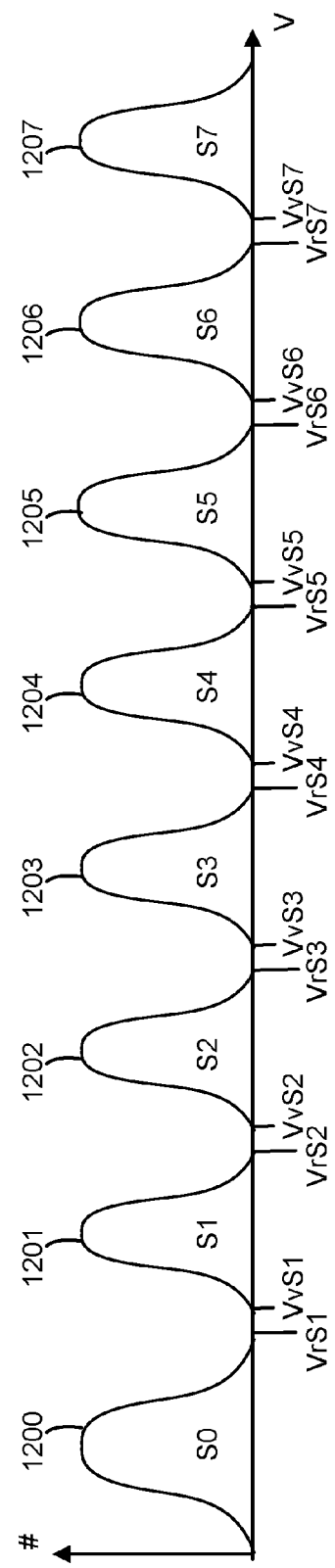

CHARGE PUMP STRENGTH CALIBRATION AND SCREENING IN CIRCUIT DESIGN

PRIORITY CLAIM

This application claims the benefit of U.S. provisional patent application No. 62/242,243, filed Oct. 15, 2015, titled "Method Of Charge Pump Strength Calibration And Screening In Memory Design," by J. Huynh et al., incorporated herein by reference.

BACKGROUND

The present technology relates to charge pumps.

Electronic devices often require regulated voltages in order to operate properly. Typically, a supply voltage of the device is provided to a voltage regulator which can translate the voltage to an output voltage at different levels. Various types of voltage regulators can be used. For example, a charge pump, or voltage converter, provides an output voltage which is different from the supply voltage. A charge pump typically uses capacitors as energy storage elements to provide an output voltage which is higher or lower than the input voltage. Moreover, a charge pump can include voltage regulation circuitry to maintain the output voltage at a constant level.

BRIEF DESCRIPTION OF THE DRAWINGS

FIG. 1A depicts an example charge pump circuit.

FIG. 1B depicts current versus voltage plots for a charge pump circuit under different fabrication process conditions.

FIG. 1C depicts voltage versus time plots corresponding to FIG. 1B.

FIG. 2E depicts example current versus voltage plots for a charge pump circuit under different fabrication process conditions and with different clock periods, showing an example operating condition for use in an evaluation process.

FIG. 6A depicts an example process for operating a charge pump such as in FIG. 2A.

FIG. 6B depicts an example process for determining a success or fail status of a charge pump, consistent with steps 601-603 of FIG. 6A.

FIG. 6C depicts another example process for determining a success or fail status of a charge pump, consistent with steps 601-603 of FIG. 6A.

FIG. 6F depicts an example regulation mode such as in step 605 of FIG. 6A.

FIG. 8A depicts an example series of clock signals and output voltages consistent with the process of FIG. 6D, where the clock period is incrementally decreased over time until a flag (FLG) changes, indicating that the output voltage (Vout) is at a specified output voltage (Vout_spec).

FIG. 8B depicts an example series of clock signals and output voltages consistent with the process of FIG. 6E, where the clock period is incrementally increased over time until a flag (FLG) changes, indicating that the output voltage (Vout) is at a specified output voltage (Vout_spec).

FIG. 9 is a block diagram of a non-volatile memory system using single row/column decoders and read/write circuits, where a power control/charge pump circuit 916 may include a charge pump as described herein.

FIG. 11 depicts an example waveform in a programming operation using program and verify voltages which are provided by a charge pump circuit.

FIG. 12 depicts example threshold voltage (Vth) distributions of memory cells for a case with eight data states, showing read and verify voltages which may be provided by a charge pump circuit.

DETAILED DESCRIPTION

Figure 2A:
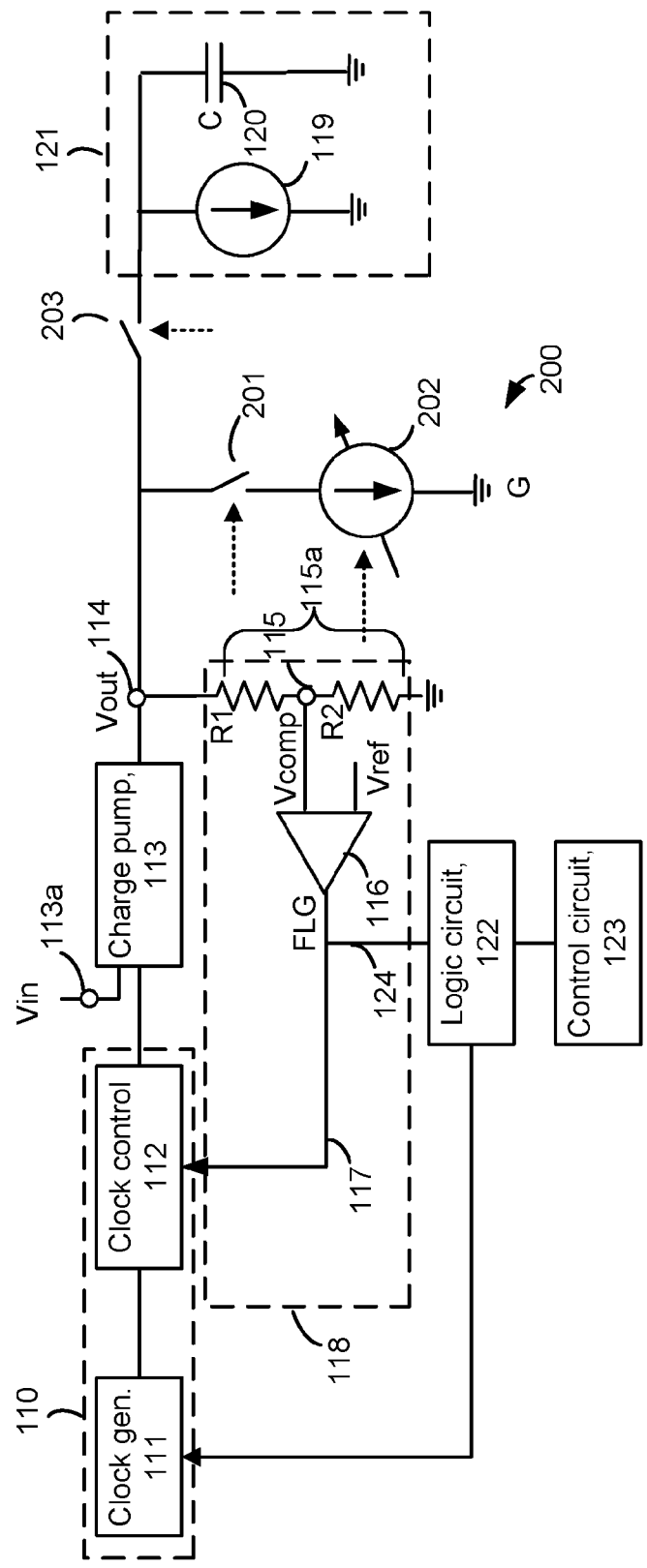
FIG. 2A depicts an example of a charge pump circuit which includes a current sink for use in an evaluation process.

Techniques are provided for screening out weak charge pumps in a circuit, and for determining an optimal period of a clock signal of a charge pump which results in a current-voltage (I-V) plot corresponding to a desired current-voltage plot over a specified range of output voltages. Corresponding apparatuses are also provided.

Charge pumps are used in semiconductor device to provide voltages at specified levels to components of the device. A charge pump generally refers to a switching voltage converter that converts an input voltage to a different output voltage. A charge pump includes a storage element such as a capacitor to repeatedly transfer charge from an input node to an output node according to a clock signal. The clock signal is used to control the timing of the opening and closing of switches which transfer the charge. A feedback mechanism may be used to regulate the output voltage at a specified level by alternately blocking the clock signal from reaching the charge pump and allowing the clock signal to reach the charge pump.

However, the strength of a charge pump can vary due to variations in the semiconductor fabrication process. For example, varying dimensions and doping levels can occur. As a result, the characteristics, e.g., I-V plot, of a charge pump can differ from the desired characteristics. Moreover, the characteristics of multiple charge pumps on the same semiconductor wafer or chip can vary from one another. This can result in differences in ramp up times of the different charge pumps.

In some cases, a charge pump may not be able to provide a specified output voltage. A failure or other defects which result in a weak charge pump may not be detected. In other cases, a charge pump may not operate with an optimal clock period. For example, a clock period which is shorter than optimal can cause excessive noise and power consumption. A weak charge pump can also cause fail bits or errors when programming user data.

The charge pumps can be designed to be stronger than necessary, on average, so that the weakest charge pumps due to the worst case process variations are still able to provide the specified output voltage. However, this result in a larger size of the charge pumps.

Techniques and apparatuses provided herein address the above and other issues. In one approach, a success or fail status is set for a charge pump by driving it with a specified clock period in a constantly pumping mode and determining if the output voltage reaches a specified output voltage. In another approach, a success or fail status is set for a charge pump by driving it with a specified clock period in a regulation mode and determining if the period in which a flag cycles between one value (0) and another value (1) is a specified multiple, e.g., 2×, of a period of the clock signal. In this case, the flag cycles according to the level of the output voltage relative to a specified output voltage. In another approach, an optimal clock period is determined by driving the charge pump with a clock signal while incrementally changing the clock period. When the flag changes, the optimal clock period has been reached. This optimal clock period is stored for subsequent use in a regulation mode of the charge pump.

In these approaches, a current sink is connected to an output node of a charge pump in a test mode and the current is set at a specified level. This approach allows charge pumps to be evaluated under uniform, carefully controlled conditions, before using the charge pumps in the end user device. The current sink is disconnected after verifying that a charge pump has met a success criterion, and/or after determining an optimal clock period. The techniques and apparatuses provided herein provided a more uniform I-V curve for all of the charge pumps on a chip or across different chips.

FIG. 1A depicts an example charge pump circuit 100 connected to a load 121. The load may include a current sink 119, as an example of a DC load, and/or a capacitor 120, as an example of an AC load. The load can represent a component in a circuit which operates using a specified input voltage. For example, in a memory device, the load can represent a word line, bit line or source line.

The charge pump circuit includes a clock source 110 which provides a clock signal constantly or alternatingly to a charge pump 113. The clock source, which is a circuit, includes a clock generator 111 which outputs a clock signal at a specified frequency to a clock control circuit 112. The clock control circuit 112 either blocks the signal from reaching the charge pump, or passes the clock signal to the charge pump. The clock control circuit therefore provides a gating function. The clock signal is responsive to a feedback circuit 118 which includes a feedback path 117, a comparator 116 and a voltage divider 115a. The voltage divider 115a divides the output voltage Vout using resistors R1 and R2 to provide a comparison voltage Vcomp at an output node 115. Vcomp is compared to a reference voltage Vref at the comparator to set a flag FLG. FLG=0 if Vcomp>Vref and FLG=1 if Vcomp<=Vref. Note that Vcomp is a known fraction (R2/(R1+R2) of Vout, so that a comparison of Vcomp to Vref by the comparator is equivalent to a comparison of Vout to a specified output voltage, Vout_spec.

When FLG=1, the clock control circuit passes the clock signal to the charge pump to operate the charge pump in a pumping mode, where charge is transferred from an input node 113a at an input voltage Vin to the output node. When FLG=0, the clock control circuit does not pass the clock signal to the charge pump, so that the charge pump operates in a non-pumping mode, where charge is not transferred from the input node to the output node. Vout will tend to decay in the non-pumping mode as the load is driven.

FIG. 1B depicts current versus voltage plots for a charge pump circuit under different fabrication process conditions. Plots 140, 141 and 142 represent slow/weak, typical and fast/strong charge pumps, respectively. A voltage range 143 represents a range of voltages in which it is desired to operate the charge pumps.

FIG. 1C depicts voltage versus time plots corresponding to FIG. 1B. Plots 150, 151 and 152 represent slow/weak, typical and fast/strong charge pumps, respectively. A voltage range 153 represents a range of voltages in which it is desired to operate the charge pumps. The plot 154 represents a regulated voltage. In some cases, different ramp up times of different charge pumps can impair the operation of the device.

FIG. 2A depicts an example of a charge pump circuit which includes a current sink for use in an evaluation process. The charge pump circuit 200 is similar to the charge pump circuit 100 of FIG. 1A but provides a current sink 202 which can be connected to the output node 114 by a switch 201 to sink a specified current to ground. The current sink may be adjustable or sink a fixed current. Additionally, a path 124 provides FLG to a logic circuit 122. The load can be connected to the output node via a switch 203. The logic circuit can provide a command to the clock generator to set a period/frequency of the clock signal. The command can be in response to FLG, in one approach. The logic circuit may communicate with a control circuit 123. For example, the logic circuit may report a success or failure status of a charge pump. The logic circuit may be on the chip while the control circuit is off the chip, in one approach. The control circuit may be part of a test device which is connected to the charge pump circuit during an evaluation process. The logic circuit can be a circuit which is capable of achieving the functionality described herein.

The logic circuit can provide on-chip logic operations. The logic circuit can interface with the control circuit 123 which can be an off-chip controller. The off-chip controller instructs the logic circuit to perform an operation such as testing or optimizing the charge pump. The logic circuit then provide the corresponding control signals to the pump and the current sink. For example, the clock period can change linearly with command inputs made by the off-chip controller and received by the clock source via the logic circuit. After the optimal clock period is determined, it can be stored in a memory array, for instance, such as the memory array 1000 in FIG. 9, and accessed by the logic circuit.

The logic circuit may have the ability to control the switches 201 and 203, as represented by the dashed line arrows. In one approach, such as during an evaluation of the charge pump, the switch 201 is closed (made conductive) while the switch 203 is open (made non-conductive). Or, the load 121 may be connected to the output node also during the evaluation. A load such as a word line should not have any DC current so having it connected to the output node during the evaluation may not affect the evaluation. In other cases, the load might affect the evaluation and can be disconnected. In another approach, such as during a regulation mode of the charge pump, the switch 201 is open while the switch 203 is closed. The logic circuit may have the ability to adjust the current of the current sink. The current sink may be provided on a chip or as part of test equipment which is connected to the charge pump circuit during an evaluation.

FIG. 2A therefore provides an apparatus, where the apparatus comprises a charge pump comprising an input node and an output node; a current source connected to the output node by a first switch during an evaluation of the charge pump, the current source sinks a specified current from the output node when connected to the output node; a clock source connected to the charge pump, the clock source provides a clock signal; a feedback circuit connected to the output node and to the clock source; and a logic circuit connected to the feedback circuit and the clock source; wherein: the feedback circuit is configured to provide a flag having one value (0) if a voltage of the output node exceeds a specified output voltage and another value (1) if the voltage of the output node does not exceed the specified output voltage; and the logic circuit is configured to evaluate the flag to determine whether the charge pump is operating at the specified output voltage.

Figure 2B:
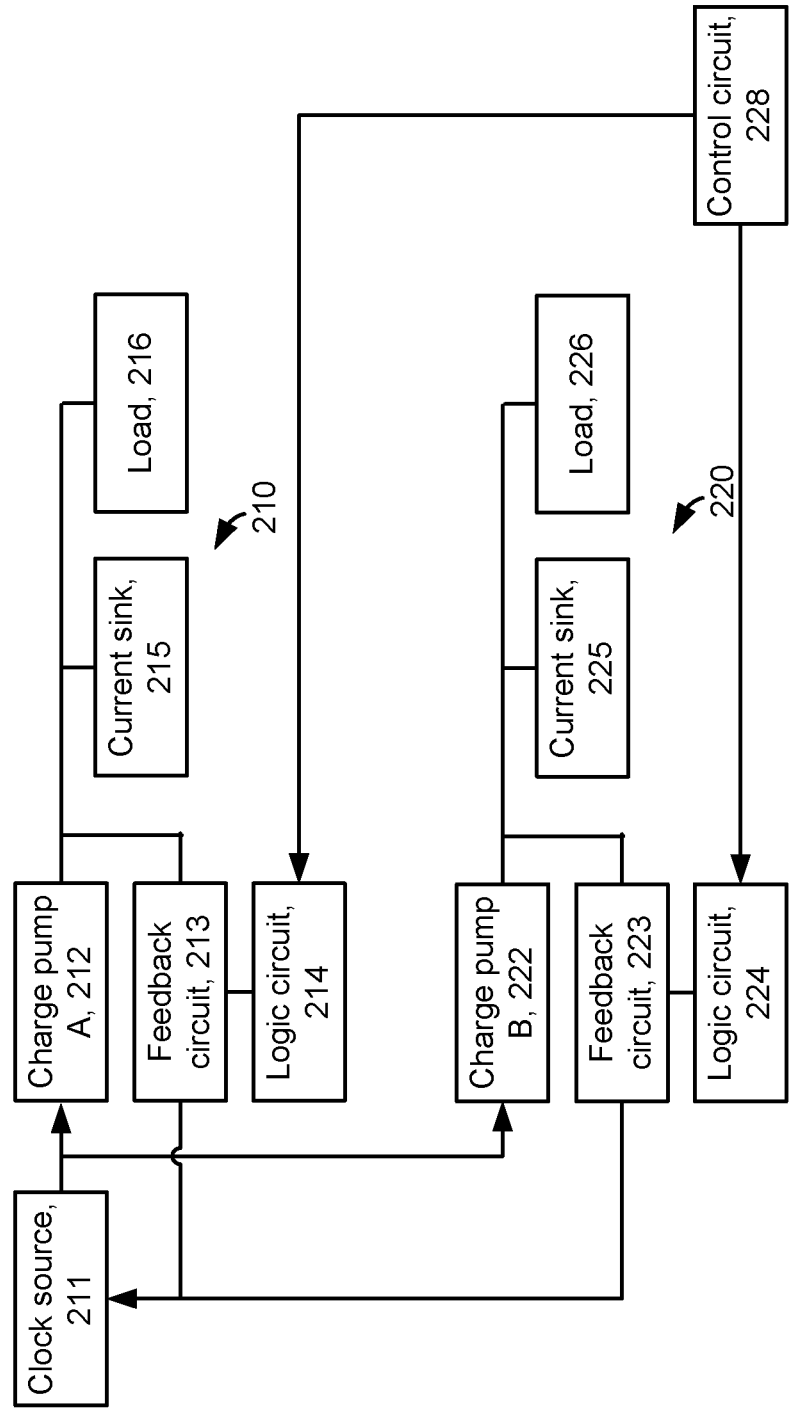
FIG. 2B depicts multiple charge pump circuits having a common clock source.

FIG. 2B depicts multiple charge pump circuits having a common clock source. In the examples of FIGS. 1A and 2A, there was one clock source and one charge pump. This approach allows the period of clock source to be adjusted to optimize the operation of the charge pump. When there are multiple charge pumps and one shared clock source, the clock source cannot be adjusted to optimize the operation of one charge pump because this will affect one or more other charge pumps. In this case, each charge pump can be evaluated to determine whether it is providing a specified output voltage.

A common clock source 211 is shared by charge pump circuits 210 and 220. The charge pump circuit 210 includes a charge pump A 212, a feedback circuit 213, a logic circuit 214, a current sink 215 and a load 216. The charge pump circuit 220 includes a charge pump B 222, a feedback circuit 223, a logic circuit 224, a current sink 225 and a load 226. The logic circuits are connected to a control circuit 228.

Figure 2C:
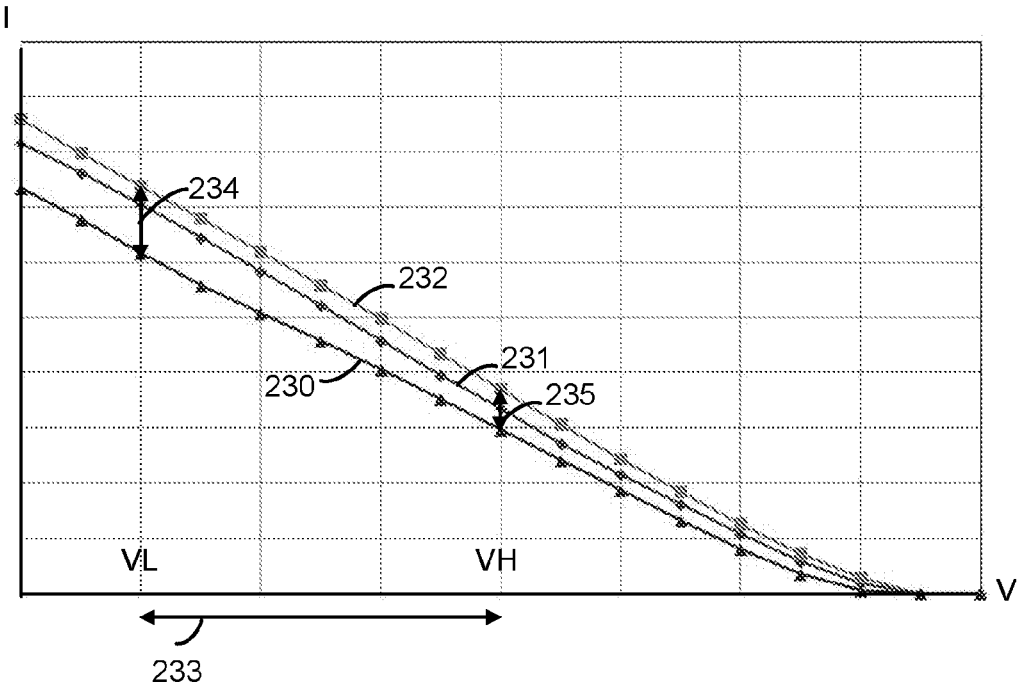
FIG. 2C depicts example current versus voltage plots for a charge pump circuit under different fabrication process conditions, consistent with the charge pump circuit of FIG. 1A.

FIG. 2C depicts example current versus voltage plots for a charge pump circuit under different fabrication process conditions, consistent with the charge pump circuit of FIG. 1A. Plots 230, 231 and 232 are provided for slow, typical and fast charge pumps, respectively. A voltage range 233 is a region of interest, that is, it is desired to provide output voltages from the charge pump in this range. An arrow 234 represents a variation of the current (I) among the different charged pumps at the lowest voltage (VL) of the range. An arrow 235 represents a variation of the current (I) among the different charged pumps at the highest voltage (VH) of the range. A common clock period is used with the charge pumps.

Figure 2D:
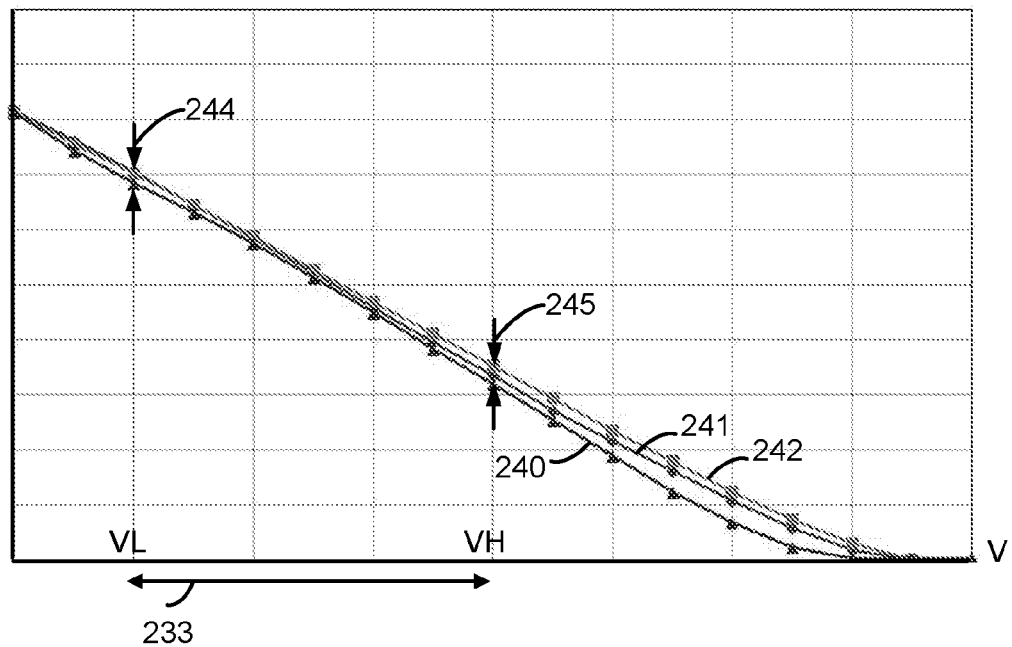
FIG. 2D depicts example current versus voltage plots for a charge pump circuit under different fabrication process conditions, consistent with the charge pump circuit of FIG. 2A, where the plot are closer to an ideal plot.

FIG. 2D depicts example current versus voltage plots for a charge pump circuit under different fabrication process conditions, consistent with the charge pump circuit of FIG. 2A, where the plot are closer to an ideal plot. Plots 240, 241 and 242 are provided for slow, typical and fast charge pumps, respectively. The variation in current is significantly reduced compared to FIG. 2C. This result is achieved by optimizing the clock period for each charge pump. An arrow 244 represents a variation of the current (I) among the different charged pumps at the lowest voltage (VL) of the range. An arrow 245 represents a variation of the current (I) among the different charged pumps at the highest voltage (VH) of the range.

FIG. 2E depicts example current versus voltage plots for a charge pump circuit under different fabrication process conditions and with different clock periods, showing an example operating condition for use in an evaluation process. For a given charge pump, the I-V plot will vary based on the clock period, CLKp. Generally, the plot will move lower when CLKp is higher (or the clock frequency is lower) and the plot will move higher when CLKp is lower (or the clock frequency is higher). Plots 250*a* and 250*b* represent a slow charge pump with relatively high and low clock periods, respectively. Plots 260*a* and 260*b* represent a typical or average charge pump with relatively high and low clock periods, respectively. Plots 270*a* and 270*b* represent a slow charge pump with relatively high and low clock periods, respectively. The plots can be obtained by modelling of the charge pumps, for instance.

In an evaluation process, a design point or example operating condition 280 can be selected which is achievable by each of the charge pumps. The operating condition identifies a specified output voltage, Vout_spec and a corresponding specified current, Ispec. The evaluation process is discussed further below, e.g., in connection with FIG. 6A-6E. As an example, the clock periods can be between about 30-60 nsec.

Figure 3A:
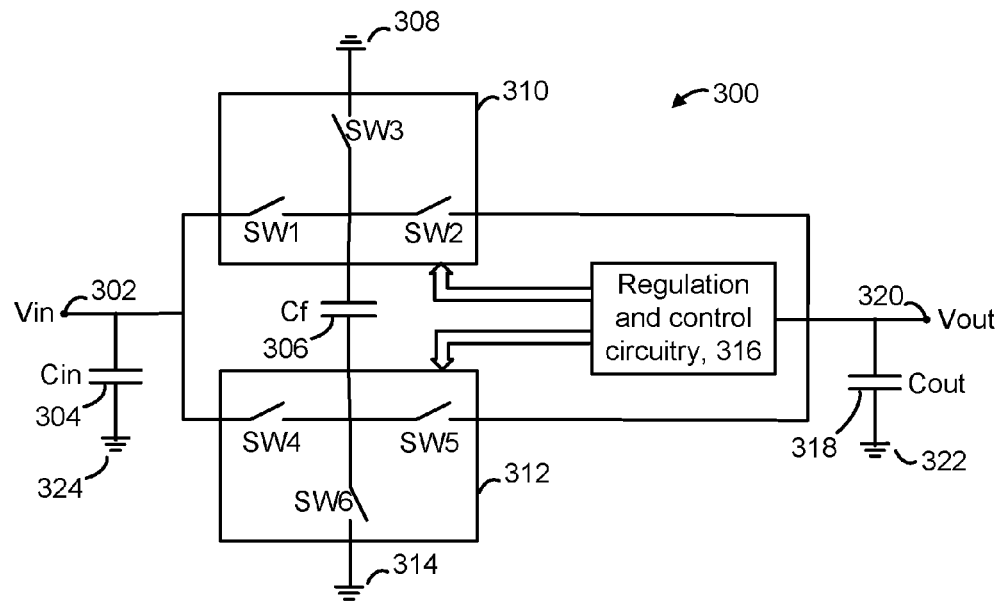
FIG. 3A depicts an example of a single-stage charge pump.
Figure 3B:
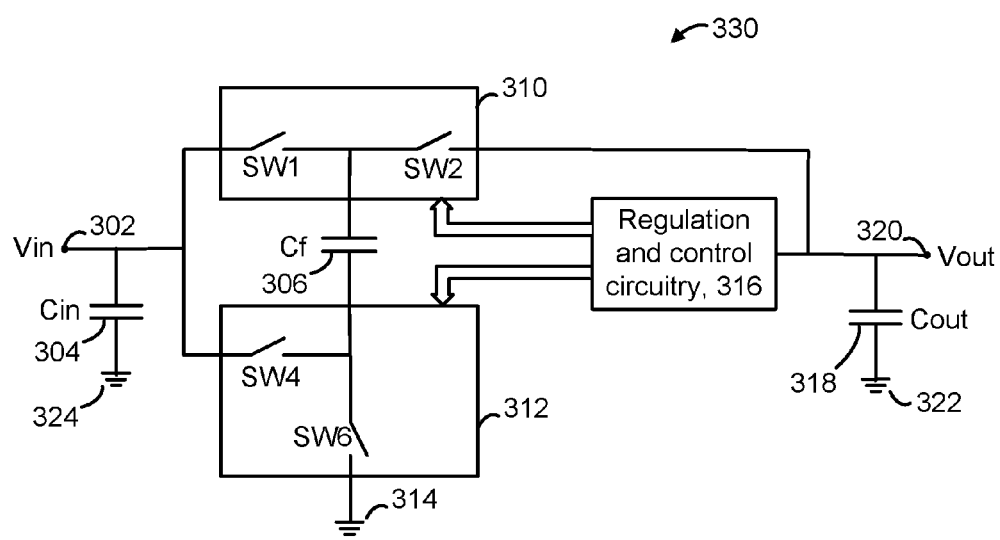
FIG. 3B depicts an example of a charge pump configured as a voltage multiplier.
Figure 3C:
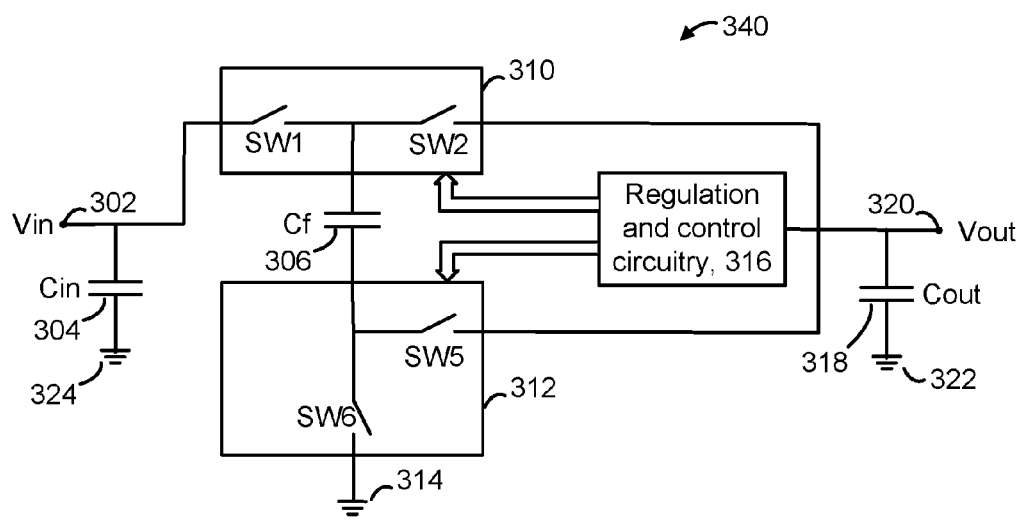
FIG. 3C depicts an example of a charge pump configured as a voltage divider.
Figure 3D:
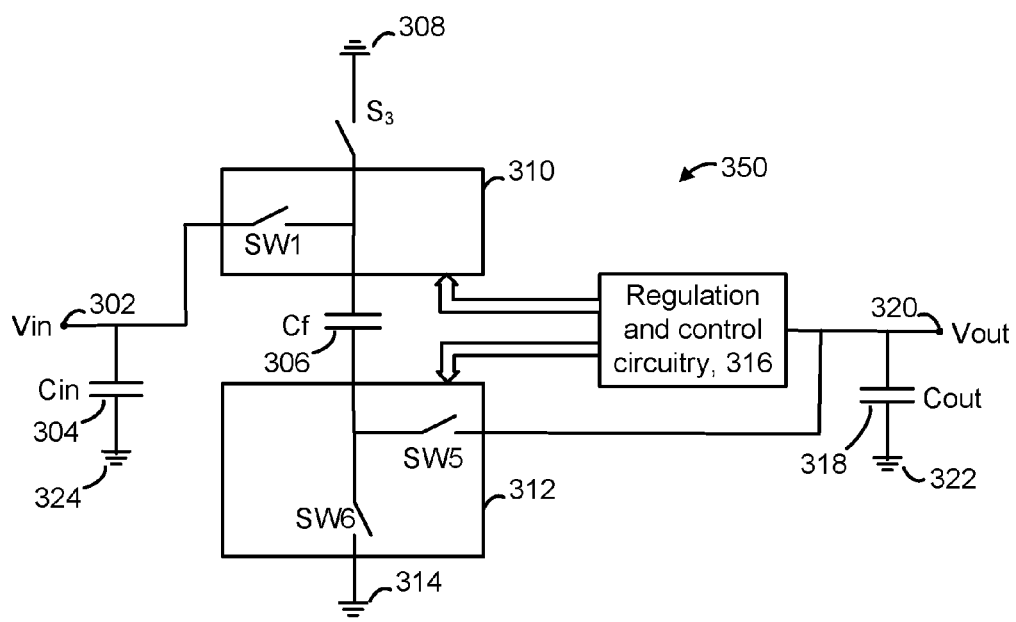
FIG. 3D depicts an example of a charge pump configured as an inverter.
Figure 3E:
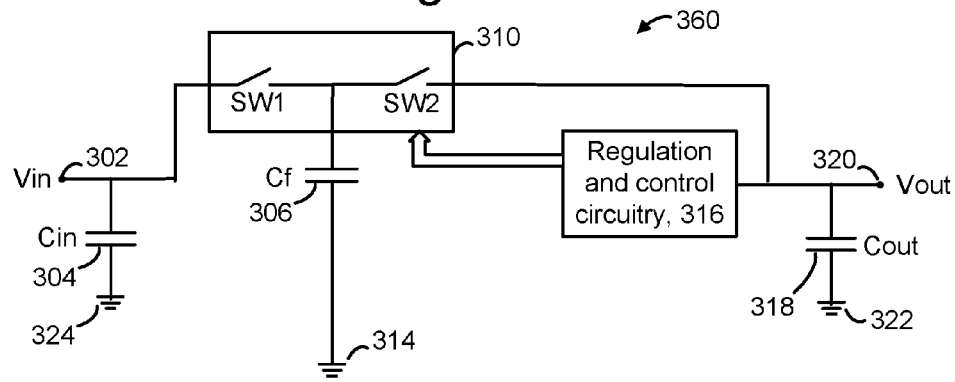
FIG. 3E depicts an example of a charge pump configured as a follower.
Figure 3F:
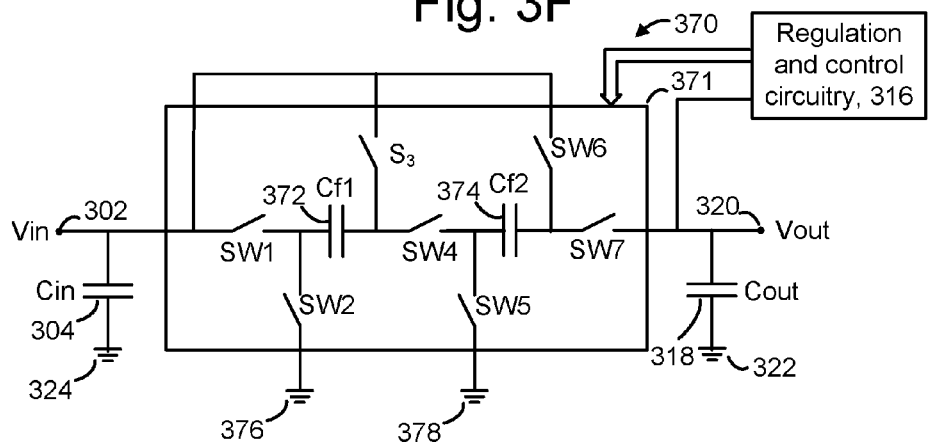
FIG. 3F depicts an example of a single-stage, multi-capacitor charge pump.
Figure 4:
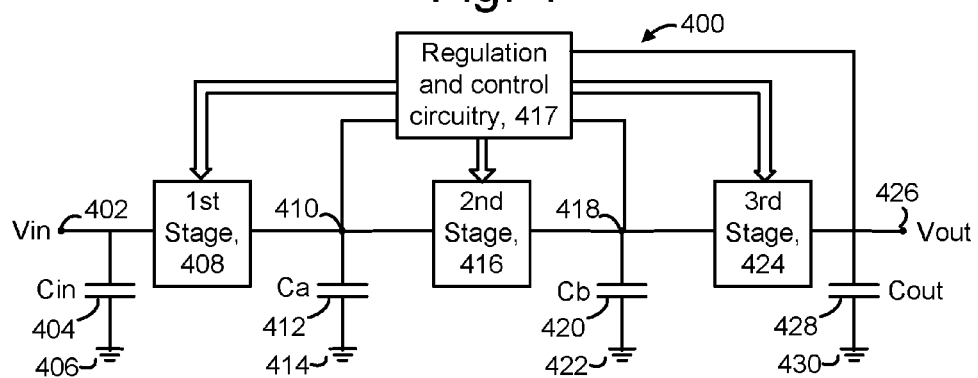
FIG. 4 depicts an example of a multi-stage charge pump.

FIG. 3A to FIG. 4 provide example configurations of a charge pump. As mentioned, a charge pump can use a capacitor to transfer charge from an input node to an output node. In one approach, a MOS (metal oxide semiconductor) capacitor is used. A capacitor can be formed by depositing a layer of metallic conductive material onto a layer of oxide that has been deposited or grown on a layer of semiconductor material, such as a semiconductor wafer, referred to as the body. The semiconductor material may be p-type or n-type, based on the polarity of the body, in which case the capacitor is referred to as being p-type or n-type, respectively. The top conducting layer may be considered to be a gate terminal, while the bottom conducting layer is a source, drain or bulk terminal. In one approach, a capacitor can be formed from a MOSFET by tying its drain, source and bulk terminal together and using the resulting device as a two-terminal device.

To be used as flying capacitor, the technology should provide an opportunity to connect the bulk terminal of the capacitor to a voltage different from that of a substrate. For standard digital technology (p-type substrate, no triple-well) an nMOS capacitor can be used, while for an n-type substrate, a pMOS capacitor can be used. For triple-well technology, any type can be used. For the follower configuration, one terminal is always grounded, so a pMOS or nMOS capacitor can be used.

FIG. 3A depicts an example of a single-stage charge pump. A charge pump generally refers to a switching voltage converter that employs an intermediate capacitive storage element which is sometimes referred to as a flying capacitor or a charge transfer capacitor. One or more flying capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The principles discussed herein can be applied to one or more stages, and to one or more capacitors in a stage. The charge pump 300 is a generalized embodiment which can be controlled for multiplier, divider, inverter and follower applications. The charge pump 300 includes an input node 302 at which a voltage Vin is applied. For example, Vin may be a fixed power supply voltage sometimes referred to as Vdd in a semiconductor chip. Charge from the voltage is maintained in an input capacitor Cin 304 which is connected to a ground node 324.

A first set of switches 310 and a second set of switches 312 are controlled by regulation and control circuitry 316 to transfer charge from the input node 302 to a flying capacitor Cf 306, and from Cf 306 to an output node 320. Vout is a resulting voltage at the output node 320, and can be greater than or less than Vin. The output node is coupled to an output capacitor Cout 318, which is connected to a ground node 322. The first set of switches 310 includes switches SW1, SW2 and SW3 which are star-connected to one terminal (such as the top conductor) of Cf. The switches may be MOSFETs, bipolar junction transistors, relay switches, or the like. SW1 connects the top conductor of Cf to the input node 302 to receive a charge from Vin. SW2 connects the top conductor of Cf to the output node 320 to transfer its charge to the output node. SW3 connects the top conductor of Cf to a ground node 308. Similarly, the second set of switches 312 includes switches SW4, SW5 and SW6 which are star-connected to another terminal (such as the bottom conductor) of Cf SW4 connects the bottom conductor of Cf to the input node 302 to receive a charge from Vin. SW5 connects the bottom conductor of Cf to the output node 320 to transfer its charge to the output node. SW6 connects the bottom conductor of Cf to a ground node 314.

Generally, the charge pump operation includes two main phases: charging Cf from the input node, and discharging Cf into the output node. During each phase, one of the switches in each set of switches is closed, connecting Cf to either the input node, the output node, or a ground node. Further, the regulation and control circuitry 316 provides the switches with appropriate control signals, including frequency, phases, amplitudes, delays, etc., depending on the particular application. The regulation and control circuitry 316 may communicate with the output node 320 as well such as to detect its level. Note that the circuits shown are examples only, as various modifications can be made.

FIG. 3B depicts an example of a charge pump 330 configured as a voltage multiplier. A voltage multiplier, or step-up charge pump, in general, provides Vout>Vin. In this configuration, the voltage multiplier provides 2×Vin>Vout>Vin, and the switches SW3 and SW5 of FIG. 3A are not needed. In a charging phase, the regulation and control circuitry 316 provides the switches with appropriate control signals so that SW1 is closed, e.g., conductive, and SW2 is open, e.g., non-conductive, so that Cf is charged via SW1. Further, SW4 is open and SW6 is closed so that the bottom conductor of Cf is connected to the ground node 314. In a discharging phase, SW1 is open and SW2 is closed, so that Cf is discharged, at least in part, to the output node 320 via SW2. Further, SW4 is closed and SW6 is open.

FIG. 3C depicts an example of a charge pump 340 configured as a voltage divider. A voltage divider, or step-down charge pump, in general, provides Vout<Vin. In this configuration, Vout<Vin/2, and the switches SW3 and SW4 of FIG. 3a are not needed. In a charging phase, the regulation and control circuitry 316 provides the switches with appropriate control signals so that SW1 is closed and SW2 is open so that Cf is charged via SW1. Further, SW5 is closed and SW6 is open so that the bottom conductor of Cf is connected to the output node 320. In a discharging phase, SW1 is open and SW2 is closed, so that Cf is discharged, at least in part, to the output node 320 via SW2. Further, SW6 is closed and SW5 is open so that the bottom conductor of Cf is connected to the ground node 314.

FIG. 3D depicts an example of a charge pump 350 configured as an inverter. An inverter provides a voltage output with an opposite polarity to the voltage input, e.g., Vout≈−Vin, (where "≈" denotes "approximately equal to"). In this configuration, the switches SW2 and SW4 of FIG. 3A are not needed. In a charging phase, the regulation and control circuitry 316 provides the switches with appropriate control signals so that SW1 is closed and SW3 is open, so that Cf is charged via SW1. Further, SW5 is open and SW6 is closed so that the bottom conductor of Cf is connected to the ground node 314. In a discharging phase, SW1 is open and SW3 is closed, so that the top conductor of Cf is connected to the ground node 308 via SW3. Further, SW5 is closed and SW6 is open so that the bottom conductor of Cf is connected to the output node 320, and Cf is discharged, at least in part, to the output node 320 via SW5.

FIG. 3E depicts an example of a charge pump 360 configured as a follower. A voltage follower provides Vout≈Vin. In this configuration, the switches SW3, SW4, SW5 and SW6 of FIG. 3A are not needed. The bottom conductor of Cf 306 is constantly connected to the ground node 314. In a charging phase, the regulation and control circuitry 316 provides the switches with appropriate control signals so that SW1 is closed and SW2 is open, so that the top conductor of Cf is connected to the input node 302 and Cf is charged via SW1. In a discharging phase, SW1 is open and SW2 is closed, so that the top conductor of Cf is connected to the output node 320 and Cf discharges to the output node 320 via SW2.

FIG. 3F depicts an example of a single-stage, multi-capacitor charge pump 370. In this example, multiple flying capacitors are provided in a single stage. While two capacitors are provided as an example, more than two may be used. There are many possible charge pump configurations with multiple flying capacitors. The charge pump 370 is configured as a voltage multiplier in which Vout≈3×Vin. Capacitors Cf1 372 and Cf2 374 are provided. A set of switches 371 includes switches SW1 to SW7. SW2 and SW5 are connected to ground nodes 376 and 378, respectively. During a charging phase, switches SW2, SW3, SW5, and SW6 are closed, while SW1, SW4 and SW7 are open, so that both flying capacitors Cf1 and Cf2 are connected in parallel and charged to the input voltage. During a discharging phase, switches SW1, SW4 and SW7 are closed, and SW2, SW3, SW5 and SW6 are open, so that the flying capacitors are connected in series between the input node 302 and the output node 320. This effectively creates an output voltage of approximately three times the input voltage.

The use of multiple flying capacitors in a single stage can provide a ratio between Vout and Vin, e.g., Vout=1.5×Vin, 3×Vin, etc., or Vout=½×Vin, ⅓×Vin, etc. For greater flexibility, a multi-stage charge pump, such as described below, can be used.

FIG. 4 depicts an example of a multi-stage charge pump 400. Vin is provided at input node 402 so that Vout is obtained at an output node 426. As an example, three stages 408, 416 and 424 are provided. Two or more stages may be used. Each stage can include switches and one or more flying capacitors as discussed previously, for example. At the input, a capacitor Cin 404 is connected at one of its conductive layers to a ground node 406. At a node 410 which is between the first stage 408 and the second stage 416, a capacitor Ca 412 is connected at one of its conductive layers to a ground node 414. At a node 418 which is between the second stage 416 and the third stage 424, a capacitor Cb 420 is connected at one of its conductive layers to a ground node 422. Finally, at the output node 426, an output capacitor Cout 428 is connected at one of its conductive layers to a ground node 430. A multi-stage charge pump can provide greater flexibility in terms of providing a greater range of output voltages. Further, each stage can include one or more capacitors to provide even greater flexibility.

The multi-stage charge pump 400 is operated under the control of regulation and control circuitry 417 which controls switching in each stage. Note that it is also possible to provide regulation and control circuitry in each stage, additionally or alternatively. Charge is transferred from the input node 402 of the first stage to a flying capacitor (not shown) in the first stage 408, and from the flying capacitor of the first stage to the node 410. Charge is then transferred from the node 410 of the second stage to a flying capacitor (not shown) in the second stage, and from the flying capacitor of the second stage to the node 418. Charge is then transferred from the node 418 to a flying capacitor (not shown) in the third stage, and from the flying capacitor of the third stage to the output node 426, assuming there are no further stages.

Figure 5A:
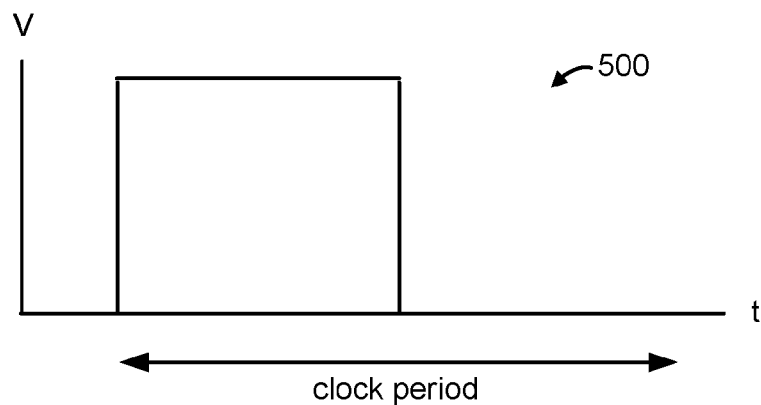
FIG. 5A depicts an example period of a clock signal of a charge pump.

FIG. 5A depicts an example period of a clock signal of a charge pump. A voltage of the signal is plotted versus time. As mentioned, regulation and control circuitry is used to provide switches in a charge pump with appropriate control signals, including frequency, phases, amplitudes, delays, etc., depending on the particular configuration. The control signals are set so that the one or more capacitors in the charge pump operate at desired operating points. Generally, the capacitor undergoes repeated cycles of charging and discharging in order to transfer charge from the input node to the output node. Thus, the applied voltage across the capacitor varies during charging and discharging. Note that Vin may be substantially constant during the charging and discharging.

The waveform 500 represent one clock period and includes a high level and a low level. These levels can be of equal or different durations.

Figure 5B:
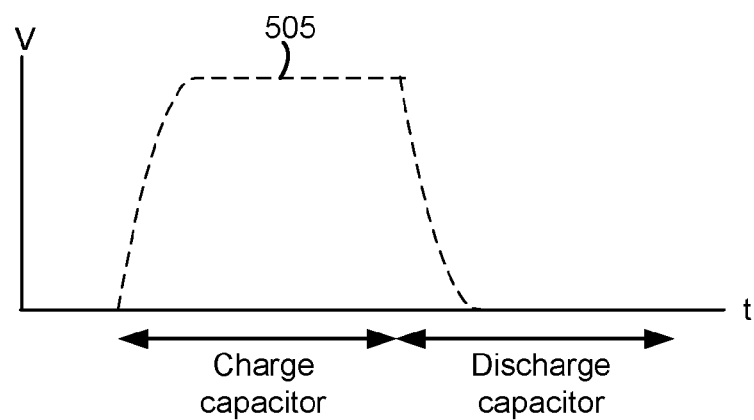
FIG. 5B depicts an example plot of a voltage of a flying capacitor in a charge pump during charging and discharging.

FIG. 5B depicts an example plot 505 of a voltage of a flying capacitor in a charge pump during charging and discharging. The voltage is plotted versus time and is time-aligned with the clock signal of FIG. 5A. The waveform 500 represent one clock period and includes a high level and a low level. In this example, charging of the capacitor occurs when the clock signal is high and discharging of the capacitor occurs when the clock signal is low.

FIG. 6A depicts an example process for operating a charge pump such as in FIG. 2A. Step 600 includes determining a data point, e.g., as defined by Vout_spec and Ispec in FIG. 2E, in an ideal I-V plot for a charge pump. Step 601 involves a test mode which includes connecting a current sink at Ispec to the output node of the charge pump, and applying a clock signal to the charge pump. The connecting can include providing the switch 201 in FIG. 2A in a conductive state. The logic circuit can instruct the clock generator to provide the clock signal. Step 602 includes evaluating the output voltage of the charge pump. For example, this can involve evaluating the FLG in FIG. 2A. Another option at step 604 involves evaluating a cycling period of the flag relative to the period of the clock signal. Step 603 sets a success or fail status for the charge pump and/or an optimal clock period. If the status is fail, the chip with the failed charge pump may be discarded, in one approach. If the status is success, step 605 involves a regulation mode which disconnects the current sink from the output node and operates the charge pump at a range of voltages which includes Vout_spec, while a load is connected to the output node.

In one approach, the process is performed once in the lifetime of a charge pump, such as at the time of manufacture. For example, the process, including the storing of the optimal value of the clock period, may occur during a die sort (testing) process for a chip on which the charge pump is fabricated. In another approach, the process can also be performed periodically over the lifetime. For example, the optimal clock period can be adjusted as the charge pump circuit ages. For example, the optimal clock period may become shorter as the charge pump circuit ages.

FIG. 6B depicts an example process for determining a success or fail status of a charge pump, consistent with steps 601-603 of FIG. 6A. Step 610 includes connecting a current sink at Ispec to the output node of the charge pump. Step 611 applies a clock signal with a specified period to the charge pump. In this process, the clock period is fixed at a desired value. Step 612 sets a flag based on a voltage of the output node (Vout) relative to Vout_spec, e.g., as described in connection with FIG. 1A. Equivalently, the flag can be set based on a comparison of Vcomp to Vref in the comparator of FIG. 2A, where Vcomp=Vout×R2/(R1+R2) and Vref=Vout+spec.×R2/(R1+R2). At a decision step 613, if the flag indicates Vout>Vout_spec, the status=success at step 614. If decision step 613 is false, the status=fail at step 615. See also FIG. 7A to 7C.

The charge pump is driven in a constantly pumping mode until the flag indicates Vout>Vout_spec, or until a specified period of time elapses. The clock period may be the same period which will be used over the lifetime of the charge pump circuit, in one approach.

FIG. 6C depicts another example process for determining a success or fail status of a charge pump, consistent with steps 601-603 of FIG. 6A. Step 620 includes connecting a current sink at Ispec to the output node of the charge pump. Step 621 applies a clock signal with an initial period to the charge pump. In this process, if the condition at decision step 623 is not true with the initial clock period, the clock period is changed until the condition at decision step 623 is true. Step 622 sets a flag based on a voltage of the output node (Vout) relative to Vout_spec, e.g., as described in connection with FIG. 1A. At a decision step 623, if the flag indicates the cycling period of the flag is 2× (or other specified integer multiple, where the integer is two or more) the period of the clock signal, the status=success at step 624. A tolerance of, e.g., +/3-5% may be allowed in the equality of decision step 623. The cycling period of the flag is a cycling period of Vout. If decision step 623 is false, in one option, the status=fail at step 626. For example, a fail status may be set if the clock period cannot be adjusted further. See also FIG. 7D.

In another option, step 625 changes the clock period in an attempt to make the condition at decision step 623 true. For example, if the cycling period of the flag is more than the specified integer multiple of the clock period, the clock period can be increased. If the cycling period of the flag is less than the specified integer multiple of the clock period, the clock period can be decreased. The clock period can be adjusted repeatedly until the condition at decision step 623 true or until a maximum or minimum allowable clock period is reached.

The charge pump is run in a regulation mode where it cycles between a pumping and non-pumping mode to maintain Vout, on average, at Vout_spec or within a specified tolerance, e.g., +/−5-10%, of Vout_spec.

Figure 6D:
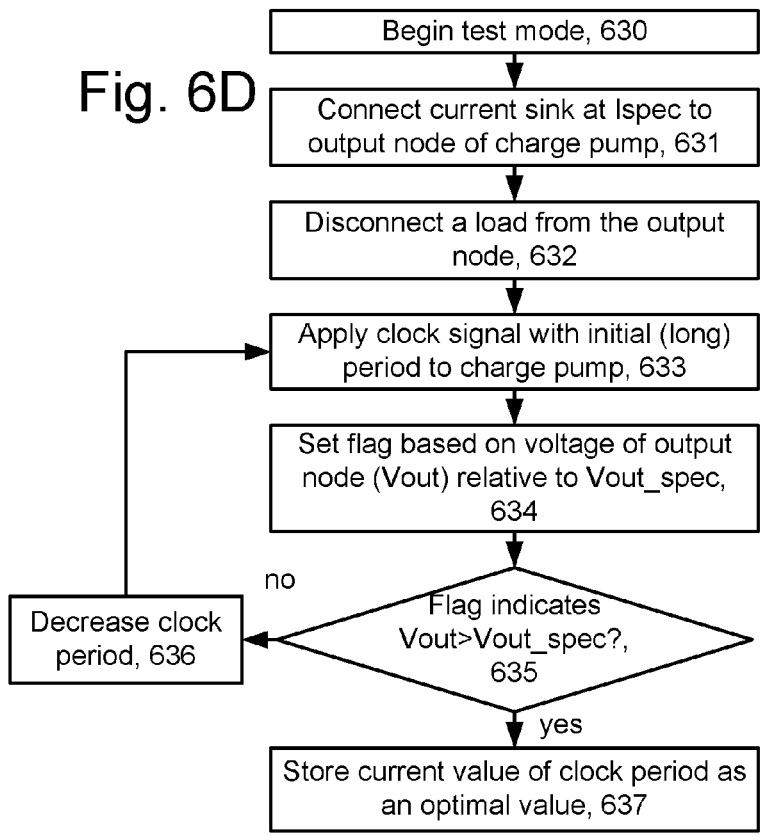
FIG. 6D depicts an example process for determining an optimal clock period by incrementally decreasing a clock period, consistent with steps 601-603 of FIG. 6A.

FIG. 6D depicts an example process for determining an optimal clock period by incrementally decreasing a clock period, consistent with steps 601-603 of FIG. 6A. A test mode begins at step 630. Step 631 includes connecting a current sink at Ispec to the output node of the charge pump. Step 632 optionally disconnects a load from the output node. The disconnecting can include providing the switch 203 in FIG. 2A in a non-conductive state. Step 633 applies a clock signal with an initial (long) period to the charge pump. For example, the initial clock period can be the longest clock period represented in FIG. 2E. Step 634 sets the flag based on a voltage of the output node (Vout) relative to Vout_spec. At a decision step 635, if the flag indicates Vout>Vout_spec, step 637 stores the current value of the clock period as an optimal value. If decision step 635 is false, step 636 decreases the clock period and step 633 is repeated. In sum, the clock period is incrementally decreased until the flag changes from indicating that Vout<=Vout_spec to indicating that Vout>Vout_spec. See also FIG. 8A. If the condition of decision step 635 is still false when the clock reaches a minimum allowable clock period, a fail status may be set.

Figure 6E:
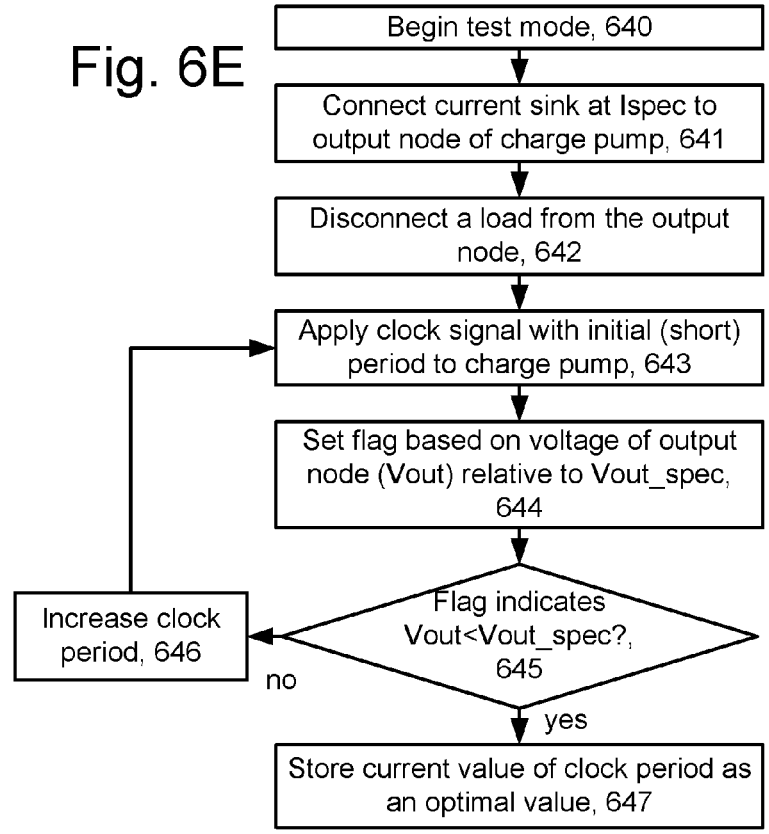
FIG. 6E depicts an example process for determining an optimal clock period by incrementally increasing a clock period, consistent with steps 601-603 of FIG. 6A.

FIG. 6E depicts an example process for determining an optimal clock period by incrementally increasing a clock period, consistent with steps 601-603 of FIG. 6A. A test mode begins at step 640. Step 641 includes connecting a current sink at Ispec to the output node of the charge pump. Step 642 optionally disconnects a load from the output node. The disconnecting can include providing the switch 203 in FIG. 2A in a non-conductive state. Step 643 applies a clock signal with an initial (short) period to the charge pump. For example, the initial clock period can be the shortest clock period represented in FIG. 2E. Step 644 sets the flag based on a voltage of the output node (Vout) relative to Vout_spec. At a decision step 645, if the flag indicates Vout<Vout_spec, step 647 stores the current value of the clock period as an optimal value. If decision step 645 is false, step 646 increases the clock period and step 643 is repeated. In sum, the clock period is incrementally increased until the flag changes from indicating that Vout>=Vout_spec to indicating that Vout<Vout_spec. See also FIG. 8B. If the condition of decision step 645 is still false when the clock reaches a maximum allowable clock period, a fail status may be set.

FIG. 6F depicts an example regulation mode such as in step 605 of FIG. 6A. In a regulation mode, the charge pump cycles between pumping and non-pumping to maintain the output at Vout_spec. Step 650 begins the regulation mode. Step 651 disconnects the current sink from the output node the of the charge pump. Step 652 connects the load to the output node the of the charge pump. Step 653 retrieves the optimal value of the clock period. Step 654 applies the clock signal with the optimal period to the charge pump. Step 655 sets a reference voltage to regulate the voltage output of the output node.

Figure 7A:
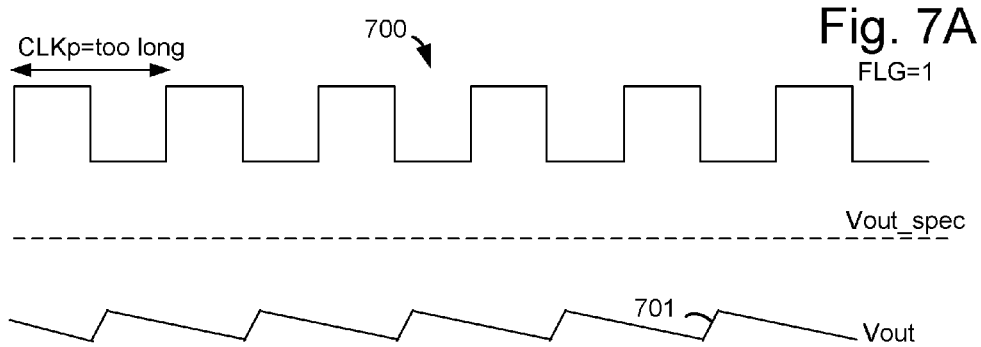
FIG. 7A depicts an example clock signal and output voltage consistent with the process of FIG. 6D, where the clock period is longer than an optimal clock period and the output voltage (Vout) is below a specified voltage (Vout_spec).

FIG. 7A depicts an example clock signal 700 and output voltage 701 consistent with the process of FIG. 6D, where the clock period is longer than an optimal clock period and the output voltage (Vout) is below a specified voltage (Vout_spec). Vout has a ripple shape due to the repeated charging and discharging of the capacitor in the charge pump. FLG=1 during the time period indicated.

Figure 7B:
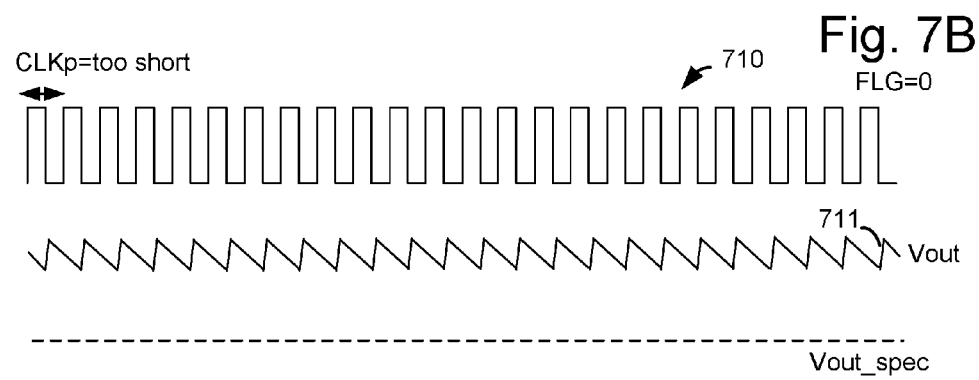
FIG. 7B depicts an example clock signal and output voltage consistent with the process of FIG. 6E, where the clock period is shorter than an optimal clock period and the output voltage (Vout) is above a specified output voltage (Vout_spec).

FIG. 7B depicts an example clock signal 710 and output voltage 711 consistent with the process of FIG. 6E, where the clock period is shorter than an optimal clock period and the output voltage (Vout) is above a specified output voltage (Vout_spec). FLG=0 during the time period indicated.

Figure 7C:
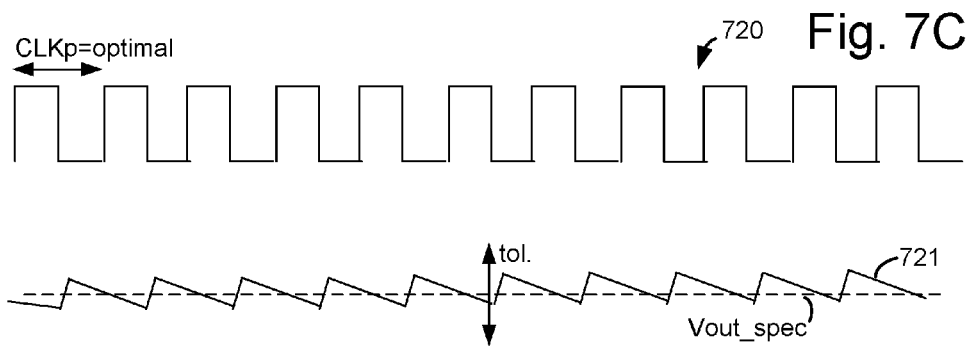
FIG. 7C depicts an example clock signal and output voltage consistent with the process of FIG. 6D or 6E, where the clock period is at an optimal clock period and the output voltage (Vout) is at a specified output voltage (Vout_spec).

FIG. 7C depicts an example clock signal 720 and output voltage 721 consistent with the process of FIG. 6D or 6E, where the clock period is at an optimal clock period and the output voltage (Vout) is at a specified output voltage (Vout_spec).

Figure 7D:
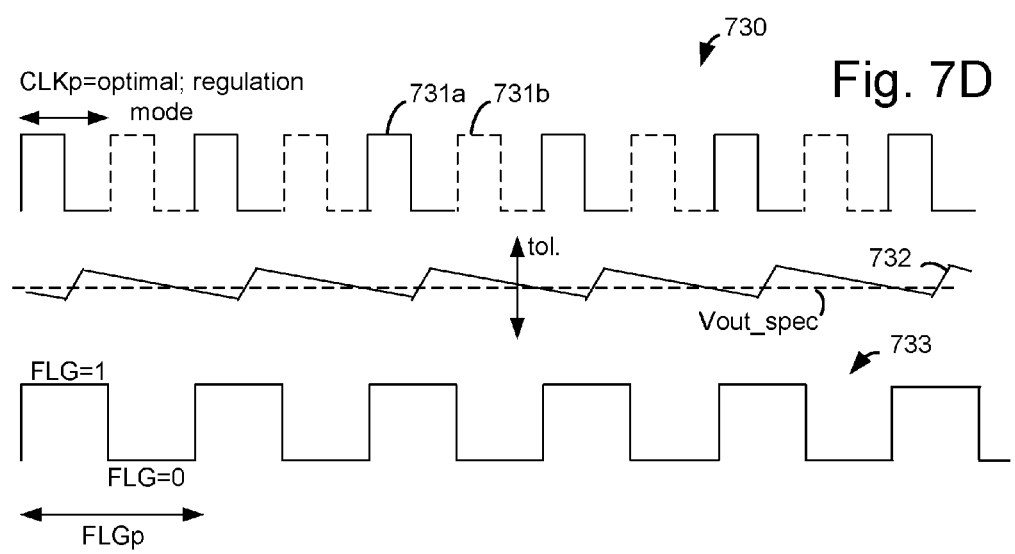
FIG. 7D depicts an example clock signal and output voltage consistent with the regulation mode of FIG. 6F, where the clock period is at an optimal clock period and the output voltage (Vout) is at a specified output voltage (Vout_spec).

FIG. 7D depicts an example clock signal 730 and output voltage 732 consistent with the regulation mode of FIG. 6F, where the clock period is at an optimal clock period and the output voltage (Vout) is at, e.g., within a tolerance (tol.) of, a specified output voltage (Vout_spec). A waveform 733 represents the FLG, which cycles between low and high values. When FLG=1, the clock signal is connected to the charge pump to provide a pumping mode which slightly increases the output voltage. When FLG=0, the clock signal is disconnected from the charge pump to provide a non-pumping mode which allows a slight decrease in the output voltage. A pulse 731a (solid line) represents a portion of the clock signal which is passed to the charge pump. A pulse 731b (dashed line) represents a portion of the clock signal which is not passed to the charge pump.

FIG. 8A depicts an example series of clock signals and output voltages consistent with the process of FIG. 6D, where the clock period is incrementally decreased over time until a flag (FLG) changes, indicating that the output voltage (Vout) is at a specified output voltage (Vout_spec). Time increase when moving to the right in the figure. Clock signals 801, 811 and 821 are used in successive time periods 800, 810 and 820, respectively. The period of the clock signals 801 and 811 is longer than optimal and the period of the clock signal 821 is optimal. The output voltage, represented by a waveform 802, transitions from 0 V to a first level in the time period 800. The output voltage, represented by a waveform 812, then transitions higher to a second level in the time period 810. The output voltage, represented by a waveform 822, then transitions higher still to Vout_spec. FLG changes, e.g., from 1 to 0 when the output first exceeds Vout_spec. The output voltages generally increase in the time periods 800a, 810a and 820a and are at a steady state in the time periods 800b, 810b and 820b.

FIG. 8B depicts an example series of clock signals and output voltages consistent with the process of FIG. 6E, where the clock period is incrementally increased over time until a flag (FLG) changes, indicating that the output voltage (Vout) is at a specified output voltage (Vout_spec). Time increase when moving to the right in the figure. Clock signals 851, 861 and 871 are used in successive time periods 850, 860 and 870, respectively. The period of the clock signals 851 and 861 is shorter than optimal and the period of the clock signal 871 is optimal. The output voltage, represented by a waveform 852, transitions from 0 V to a first level in the time period 850. The output voltage, represented by a waveform 862, then transitions lower to a second level in the time period 860. The output voltage, represented by a waveform 872, then transitions lower still to Vout_spec. FLG changes, e.g., from 0 to 1 when the output first falls below Vout_spec. The output voltages generally decrease in the time periods 850*a*, 860*a* and 870*a* and are at a steady state in the time periods 850*b*, 860*b* and 870*b*.

FIG. 9 is a block diagram of a non-volatile memory system using single row/column decoders and read/write circuits, where a power control/charge pump circuit 916 may include a charge pump as described herein. The system may include many blocks of storage elements such as provided in FIG. 10. A memory device 900 has read/write circuits for reading and programming a page of storage elements in parallel, and may include one or more memory die 902. Memory die 902 includes a two-dimensional array 1000 of storage elements, which may include several of the blocks 1001 of FIG. 10, control circuitry 910, and read/write circuits 965. In some embodiments, the array of storage elements can be three dimensional. The memory array is addressable by word lines via a row decoder 930 and by bit lines via a column decoder 960. The read/write circuits 965 include multiple sense blocks 901 and allow a page of storage elements to be read or programmed in parallel. Typically a controller 950 is included in the same memory device (e.g., a removable storage card) as the one or more memory die 902. Commands and data are transferred between the host 999 and controller 950 via lines 920 and between the controller and the one or more memory die 902 via lines 921.

The control circuitry 910 cooperates with the read/write circuits 965 to perform operations on the memory array. The control circuitry 910 includes a state machine 912, an on-chip address decoder 914 and a power control/charge pump circuit 916. In an example embodiment, the power control/charge pump circuit 916 is a step-down regulated charge pump for supplying a logic voltage, e.g., 1.2 V logic, in a non-volatile storage product. In another example embodiment, the power control/charge pump circuit 916 is a step-up regulated charge pump which supports a 1.8 V host in a non-volatile storage product.

The state machine 912 provides chip-level control of memory operations. For example, the state machine may be configured to perform read and verify processes. The on-chip address decoder 914 provides an address interface between that used by the host or a memory controller to the hardware address used by the decoders 930 and 960. The power control/charge pump circuit 916 controls the power and voltages supplied to the word lines and bit lines during memory operations.

In some implementations, some of the components of FIG. 9 can be combined. In various designs, one or more of the components (alone or in combination), other than memory array 1000, can be thought of as a managing or control circuit. For example, one or more managing or control circuits may include any one of, or a combination of, control circuitry 910, state machine 912, decoders 914/960, power control 916, sense blocks 901, read/write circuits 965, controller 950, host controller 999, and so forth. One or more managing or control circuits may also include logic circuits 122, 214 and 224 and control circuits 123 and 228, discussed previously.

The data stored in the memory array is read out by the column decoder 960 and output to external I/O lines via the data I/O line and a data input/output buffer. Program data to be stored in the memory array is input to the data input/output buffer via the external I/O lines. Command data for controlling the memory device are input to the controller 950. The command data informs the flash memory of what operation is requested. The input command is transferred to the control circuitry 910. The state machine 912 can output a status of the memory device such as READY/BUSY or PASS/FAIL. When the memory device is busy, it cannot receive new read or write commands.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

Note that the one or more capacitors in the charge pump may be on-chip (internal) or off-chip (external). For example, in an internal configuration, the capacitor may be formed on a silicon substrate which serves as the lower conductive layer of the capacitor. Fully integrating the charge pump on the chip also saves the cost of external components and assembly, along with a number of dedicated pads.

Figure 10:
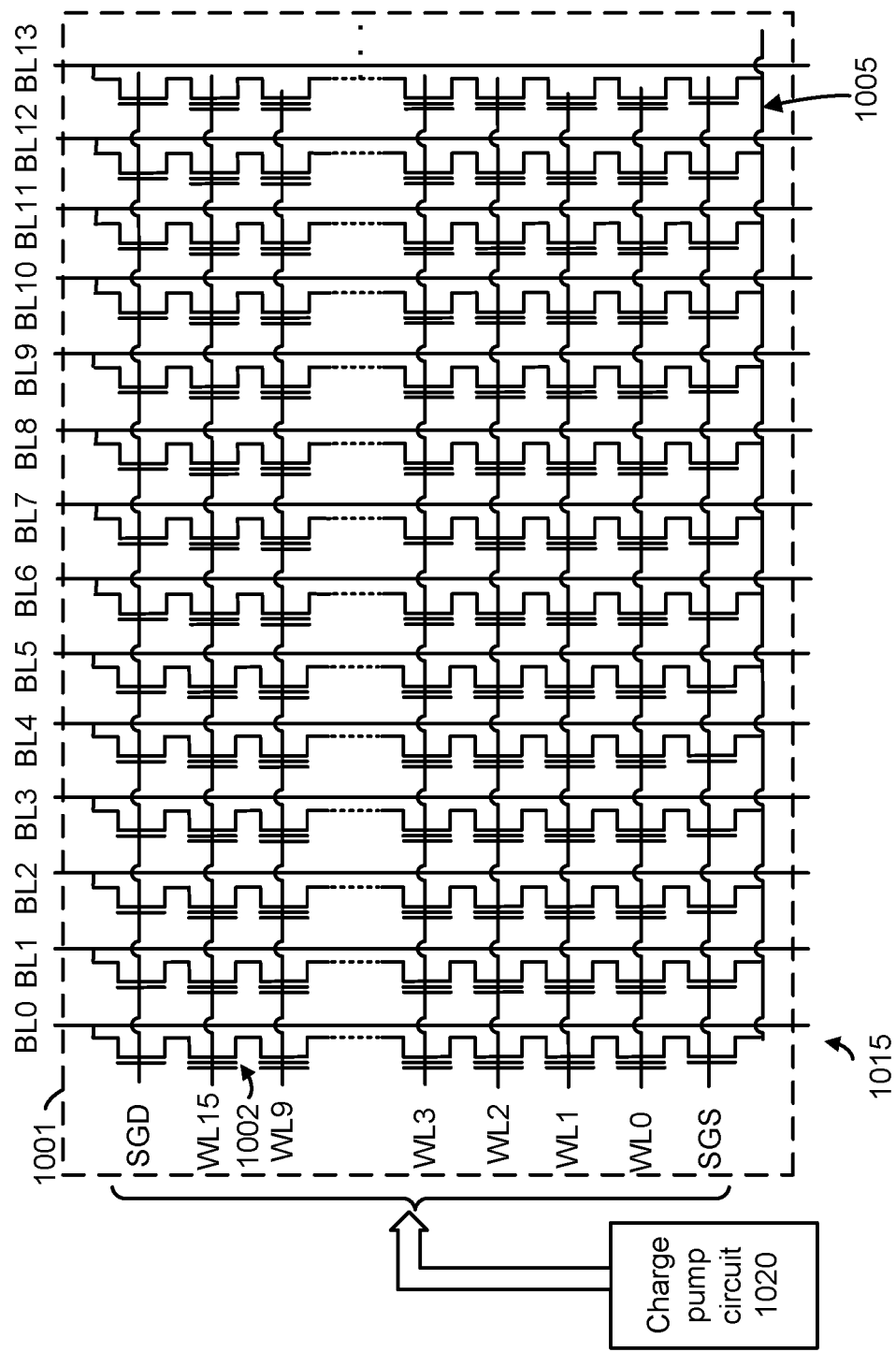
FIG. 10 depicts a block of memory cells in an example configuration of the memory array 1000 of FIG. 9.

FIG. 10 depicts a block 1001 of memory cells in an example configuration of the memory array 1000 of FIG. 9. As mentioned, a charge pump provides an output voltage which is different from a supply or input voltage. In one example application, a charge pump circuit 1020 is used to provide voltages at different levels during erase, program or read operations in a non-volatile memory device such as a NAND flash EEPROM. In such a device, the block includes a number of storage elements which communicate with respective word lines WL0-WL15, respective bit lines BL0-BL13, and a common source line 1005. An example storage element 1002 is depicted. In the example provided, sixteen storage elements are connected in series to form a NAND string (see example NAND string 1015), and there are sixteen data word lines WL0 through WL15. Moreover, one terminal of each NAND string is connected to a corresponding bit line via a drain select gate (connected to select gate drain line SGD), and another terminal is connected to a common source 1005 via a source select gate (connected to select gate source line SGS). Thus, the common source 1005 is coupled to each NAND string. The block 1001 is typically one of many such blocks in a memory array.

In an erase operation, a high voltage such as 20 V is applied to a substrate on which the NAND string is formed to remove charge from the storage elements. During a programming operation, a voltage in the range of 12-21 V is applied to a selected word line. In one approach, step-wise increasing program pulses are applied until a storage element is verified to have reached an intended state. Moreover, pass voltages at a lower level may be applied concurrently to the unselected word lines. In read and verify operations, the select gates (SGD and SGS) are connected to a voltage in a range of 2.5 to 4.5 V and the unselected word lines are raised to a read pass voltage, Vread, (typically a voltage in the range of 4.5 to 6 V) to make the transistors operate as pass gates. The selected word line is connected to a voltage, a level of which is specified for each read and verify operation, to determine whether a Vth of the concerned storage element is above or below such level.

In practice, the output of a charge pump may be used to provide different voltages concurrently to different word lines or groups of word lines. It is also possible to use multiple charge pumps to supply different word line voltages. Similarly, the output from a charge pump can be provided to a bit line or other location as needed in the memory device.

FIG. 11 depicts a waveform of an example programming operation using voltages which are provided by a charge pump circuit. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, S1- and S2-state verify voltages of VvS1 and VvS2, respectively, (waveform 1110) may be applied after each of the program voltages 1101 and 1102. S1-, S2- and S3-state verify voltages of VvS1, VvS2 and VvS3 (waveform 1111) may be applied after each of the program voltages 1103 and 1104. After several additional program loops, not shown, S5-, S6- and S7-state verify voltages of VvS5, VvS6 and VvS7 (waveform 1112) may be applied after the final program voltage 1106.

FIG. 12 depicts example Vth distributions of memory cells for a case with eight data states, showing read and verify voltages which may be provided by a charge pump circuit. This example has eight data states, S0-S7. The S0, S1, S2, S3, S4, S5, S6 and S7 states are represented by the Vth distributions 1200, 1201, 1202, 1203, 1204, 1205, 1206, 1207, respectively, have verify voltages of VvS1, VvS2, VvS3, VvS4, VvS5, VvS6 and VvS7, respectively, and have read voltages of VrS1, VrS2, VrS3, VrS4, VrS5, VrS6 and VrS7, respectively. A pass voltages may also be provided by a charge pump circuit. A pass voltage is high enough to provide a memory cell in a strongly conductive state.

Accordingly, in one embodiment, an apparatus comprises: a charge pump comprising an input node and an output node; a current source connected to the output node by a first switch during an evaluation of the charge pump, the current source sinks a specified current from the output node when connected to the output node; a clock source connected to the charge pump, the clock source provides a clock signal; a feedback circuit connected to the output node and to the clock source; and a logic circuit connected to the feedback circuit and the clock source; wherein: the feedback circuit is configured to provide a flag having one value (0) if a voltage of the output node exceeds a specified output voltage and another value (1) if the voltage of the output node does not exceed the specified output voltage; and the logic circuit is configured to evaluate the flag to determine whether the charge pump is operating at the specified output voltage.

In another embodiment, an apparatus comprises: a charge pump comprising an input node and an output node; a current source connected to the output node by a first switch during an evaluation of the charge pump, the current source sinks a specified current from the output node when connected to the output node; a clock source connected to the charge pump, the clock source provides a clock signal; a feedback circuit connected to the output node and to the clock source; and a logic circuit connected to the feedback circuit and the clock source; wherein: the feedback circuit is configured to provide a flag having one value (0) if a voltage of the output node exceeds a specified output voltage and another value (1) if the voltage of the output node does not exceed the specified output voltage; with the clock signal set at a specified frequency, the logic circuit is configured to evaluate the flag to determine whether the charge pump is operating at least at the specified output voltage; and the logic circuit is configured to set a success status for the charge pump in response to determining that the charge pump is operating at least at the specified output voltage and to set a failure status for the charge pump in response to determining that the charge pump is not operating at least at the specified output voltage.

In another embodiment, a method comprises: providing a clock signal to a charge pump which comprises an input node and an output node; sinking a specified current from the output node; providing a flag having one value (0) if a voltage of the output node exceeds a specified output voltage and another value (1) if the voltage of the output node does not exceed the specified output voltage; and evaluating the flag to determine whether the charge pump is operating at the specified output voltage.

In another embodiment, an apparatus comprises: means for providing a clock signal to a charge pump which comprises an input node and an output node; means for sinking a specified current from the output node; means for providing a flag having one value (0) if a voltage of the output node exceeds a specified output voltage and another value (1) if the voltage of the output node does not exceed the specified output voltage; and means for evaluating the flag to determine whether the charge pump is operating at the specified output voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. An apparatus, comprising:
a charge pump comprising an input node and an output node;
a current source connected to the output node by a first switch during an evaluation of the charge pump, the current source sinks a specified current from the output node when connected to the output node;
a clock source connected to the charge pump, the clock source provides a clock signal;

a feedback circuit connected to the output node and to the clock source; and a logic circuit connected to the feedback circuit and the clock source; wherein:

the feedback circuit is configured to provide a flag having one value if a voltage of the output node exceeds a specified output voltage and another value if the voltage of the output node does not exceed the specified output voltage; and the logic circuit is configured to evaluate the flag to determine whether the charge pump is operating at the specified output voltage.

2. The apparatus of claim 1, wherein the logic circuit is configured to:

change a period of the clock signal until the flag cycles between the one value and the another value with a period which is a specified multiple of a period of the clock signal.

3. The apparatus of claim 2, wherein:

the specified multiple is two.

4. The apparatus of claim 1, wherein the logic circuit is configured to:

change a period of the clock signal until the flag changes;

detect when the flag changes;

store data indicative of an optimal value of the period of the clock signal, the optimal value of the period of the clock signal is a value of the period of the clock signal when the flag changes;

retrieve the data for use in setting the period of the clock signal to the optimal value; and while the clock period is set to the optimal value, drive the charge pump over a range of output voltages which includes the specified output voltage and control the first switch to disconnect the current source from the output node.

5. The apparatus of claim 4, wherein:

the logic circuit, to change the period of the clock signal, is configured to decrease the period of the clock signal until the flag changes from the another value indicating the voltage of the output node does not exceed the specified output voltage to the one value indicating the voltage of the output node exceeds the specified output voltage.

6. The apparatus of claim 4, wherein:

the logic circuit, to change the period of the clock signal, is configured to increase a period of the clock signal until the flag changes from the one value indicating the voltage of the output node exceeds the specified output voltage to the another value indicating the voltage of the output node does not exceed the specified output voltage.

7. The apparatus of claim 4, wherein:

the optimal value of the period of the clock signal results in a current-voltage plot of the charge pump corresponding to a desired current-voltage plot over a specified range of output voltages.

8. The apparatus of claim 1, wherein:

the logic circuit is configured to control the first switch to disconnect the current source from the output node after the logic circuit determines that the charge pump is operating at the specified output voltage and while operating the charge pump over a range of output voltages which includes the specified output voltage.

9. The apparatus of claim 1, further comprising:

a second switch, the logic circuit is configured to control the second switch to disconnect a load from the output node while determining whether the charge pump is operating at the specified output voltage, and to connect the load to the output node after determining that the charge pump is operating at the specified output voltage and while operating the charge pump over a range of output voltages which includes the specified output voltage.

10. The apparatus of claim 1, wherein:

the clock source is configured to connect the clock signal to the charge pump when the flag has the another value and to not connect the clock signal to the charge pump when the flag has the one value.

11. The apparatus of claim 1, wherein:

the feedback circuit comprises a voltage divider connected to the output node of the charge pump, wherein the logic circuit comprises a comparator, the comparator is configured to compare a voltage of an output node of the voltage divider to a reference voltage, to set the flag to the one value when the voltage of the output node of the voltage divider exceeds the reference voltage, and to set the flag to the another value when the output node of the voltage divider does not exceed the reference voltage.

12. The apparatus of claim 1, wherein:

the clock source comprises a clock generator and a clock control circuit;

the clock generator is configured to generate the clock signal in response to a command from the logic circuit; and the clock control circuit is configured to pass the clock signal to the charge pump when the flag has the another value and to not pass the clock signal to the charge pump when the flag has the one value.

13. An apparatus, comprising:

a charge pump comprising an input node and an output node;

a current source connected to the output node by a first switch during an evaluation of the charge pump, the current source sinks a specified current from the output node when connected to the output node;

a clock source connected to the charge pump, the clock source provides a clock signal;

a feedback circuit connected to the output node and to the clock source; and a logic circuit connected to the feedback circuit and the clock source; wherein:

the feedback circuit is configured to provide a flag having one value if a voltage of the output node exceeds a specified output voltage and another value if the voltage of the output node does not exceed the specified output voltage;

with the clock signal set at a specified frequency, the logic circuit is configured to evaluate the flag to determine whether the charge pump is operating at least at the specified output voltage; and the logic circuit is configured to set a success status for the charge pump in response to determining that the charge pump is operating at least at the specified output voltage and to set a failure status for the charge pump in response to determining that the charge pump is not operating at least at the specified output voltage.

14. The apparatus of claim 13, further comprising:

a second switch, wherein while determining whether the charge pump is operating at least at the specified output voltage, the logic circuit is configured to control the second switch to disconnect a load from the output node and to control the first switch to connect the current source to the output node.

15. The apparatus of claim 14, wherein:
after setting the success status for the charge pump, the logic circuit is configured to control the first switch to disconnect the current source from the output node and to control the second switch to connect the load to the output node.

16. A method, comprising:
providing a clock signal to a charge pump which comprises an input node and an output node;
sinking a specified current from the output node;
providing a flag having one value if a voltage of the output node exceeds a specified output voltage and another value if the voltage of the output node does not exceed the specified output voltage; and
evaluating the flag to determine whether the charge pump is operating at the specified output voltage.

17. The method of claim 16, wherein:
the evaluating comprises determining whether the flag cycles between the one value and the another value with a period which is a specified multiple of a period of the clock signal.

18. The method of claim 16, further comprising:
changing a period of the clock signal, wherein the detecting comprises determining when the flag changes during the changing of the period of the clock signal; and
storing data indicative of an optimal value of the period of the clock signal, the optimal value of the period of the clock signal is a value of the period of the clock signal when the flag changes.

19. The method of claim 18, further comprising:
stopping the sinking of the specified current from the output node;
retrieving the data;
setting the period of the clock signal to the optimal value based on the data; and
providing the clock signal to the charge pump while the period of the clock signal is set to the optimal value.

20. An apparatus, comprising:
means for providing a clock signal to a charge pump which comprises an input node and an output node;
means for sinking a specified current from the output node;
means for providing a flag having one value if a voltage of the output node exceeds a specified output voltage and another value if the voltage of the output node does not exceed the specified output voltage; and
means for evaluating the flag to determine whether the charge pump is operating at the specified output voltage.

* * * * *